US012707932B2

(12) United States Patent
Krishnatreya et al.

(10) Patent No.: US 12,707,932 B2
(45) Date of Patent: Aug. 11, 2026

(54) HANDLING ASSEMBLY, HANDLING SYSTEM AND METHOD

(71) Applicant: Intel Corporation, Santa Clara, CA (US)

(72) Inventors: Bhaskar Jyoti Krishnatreya, Hillsboro, OR (US); Michael J. Baker, Gilbert, AZ (US); Feras Eid, Chandler, AZ (US); Wenhao Li, Chandler, AZ (US); Veronica Strong, Brussels (BE); Thomas Sounart, Chandler, AZ (US); Adel A. Elsherbini, Chandler, AZ (US); Johanna M. Swan, Scottsdale, AZ (US); Kimin Jun, Portland, OR (US); Yi Shi, Chandler, AZ (US); Xavier Brun, Chandler, AZ (US); Shawna M. Liff, Scottsdale, AZ (US); Edison Chien-An Chen, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 183 days.

(21) Appl. No.: 18/393,769

(22) Filed: Dec. 22, 2023

(65) Prior Publication Data

US 2025/0210392 A1 Jun. 26, 2025

(51) Int. Cl.

*H01T 23/00* (2006.01)
*H10P 72/00* (2026.01)
*H10P 72/50* (2026.01)
*H10P 72/72* (2026.01)

(52) U.S. Cl.

CPC ........ *H10P 72/722* (2026.01); *H10P 72/0446* (2026.01); *H10P 72/50* (2026.01)

(58) Field of Classification Search

IPC ........................................................ H01L 21/6833

See application file for complete search history.

(56) References Cited

U.S. PATENT DOCUMENTS 6,132,517 A * 10/2000 Sivaramakrishnan ........................ C23C 16/4586 156/345.31
2019/0311933 A1* 10/2019 White ................. H01L 21/6833
2022/0013383 A1* 1/2022 Savandaiah ........... C23C 14/505

* cited by examiner

*Primary Examiner* — Stephen W Jackson

(74) *Attorney, Agent, or Firm* — Viering, Jentschura & Partner mbB

(57) ABSTRACT

Various aspects may provide a handling assembly. The handling assembly may include a body with a component-handling surface. The component-handling surface may include a first component-handling region configured to accommodate a first semiconductor component arrangement and a second component-handling region configured to accommodate a second semiconductor component arrangement. The handling assembly may further include an electrode arrangement disposed at the body in a manner so as to be capable of independently toggling each of the first component-handling region and the second component-handling region between an active state and an inactive state. In the active state the electrode arrangement may provide an electrostatic retention force over the component-handling region, configured to retain a corresponding semiconductor component arrangement on the component-handling region.

20 Claims, 19 Drawing Sheets providing a handling assembly comprising a body with a component-handling surface disposing an electrode arrangement relative to the body configuring the electrode arrangement such that, in the active state, the electrode arrangement provides an electrostatic retention force over a respective component-handling region of the component-handling surface of the body of the handling assembly

FIG. 6

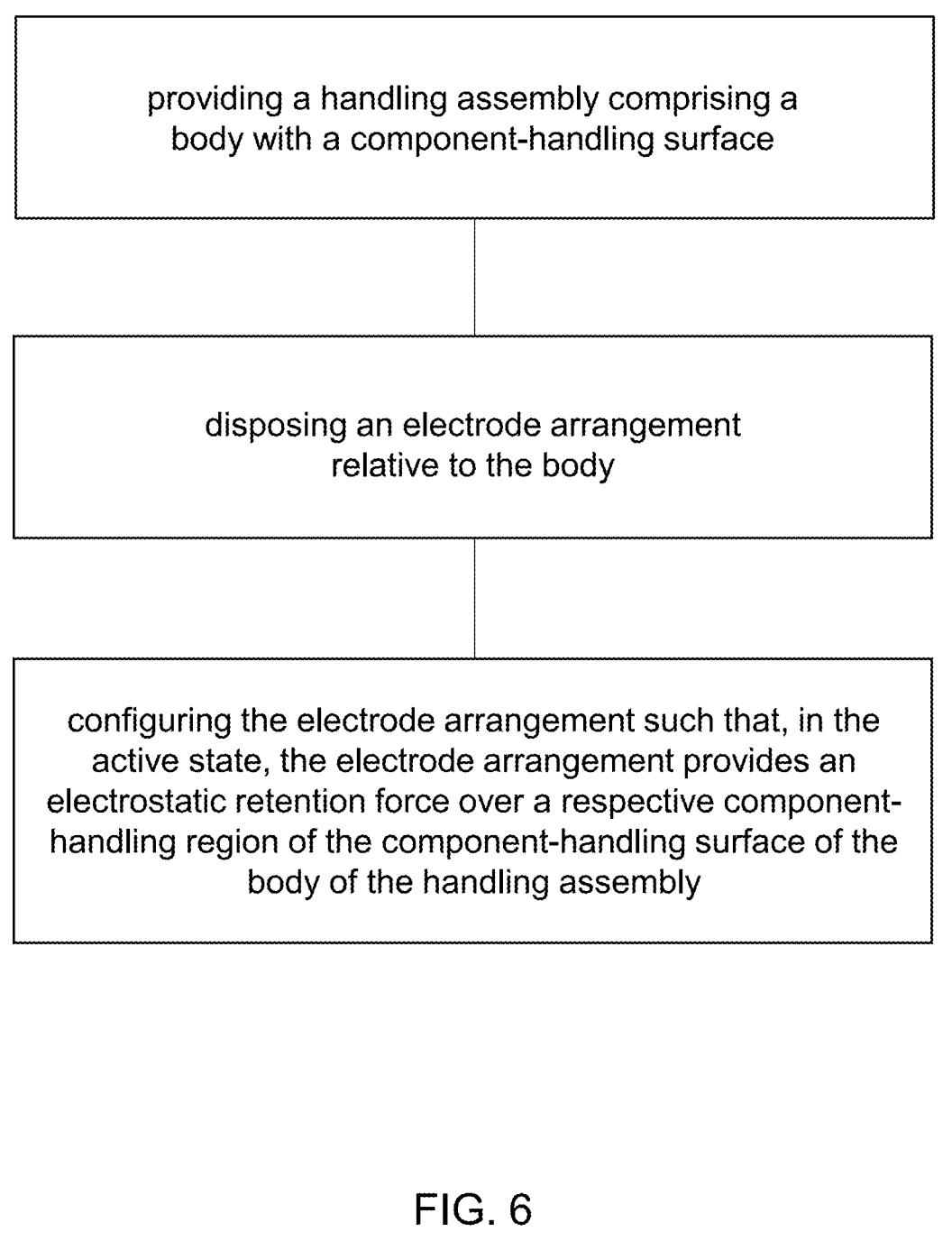

HANDLING ASSEMBLY, HANDLING SYSTEM AND METHOD

BACKGROUND

Die placement processes within the semiconductor manufacturing field ensure proper assembly of semiconductor components (e.g. dies).

Traditional techniques for die placement rely on bond head tools to position dies on a wafer. These conventional tools often employ mechanical forces to both place and release the dies. However, the physical contact and force used in such mechanical handling can result in microcracks, fractures, or other types of structural damage to the dies. This, in turn, can lead to reduced product reliability, increased defect rates, and ultimately a decrease in production yield.

Furthermore, traditional die placement processes typically entail the sequential placement of one die at a time, culminating in a time-consuming process. This low throughput approach significantly impedes overall manufacturing efficiency.

In light of these challenges, there is a need for an improved die placement device and/or method which can address, at the very least, the issues mentioned above.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. In the following description, various aspects are described with reference to the following drawings, in which:

FIG. 6 is a flow chart depicting a method of assembling a handling assembly, according to various aspects.

DETAILED DESCRIPTION

Figure 1A:
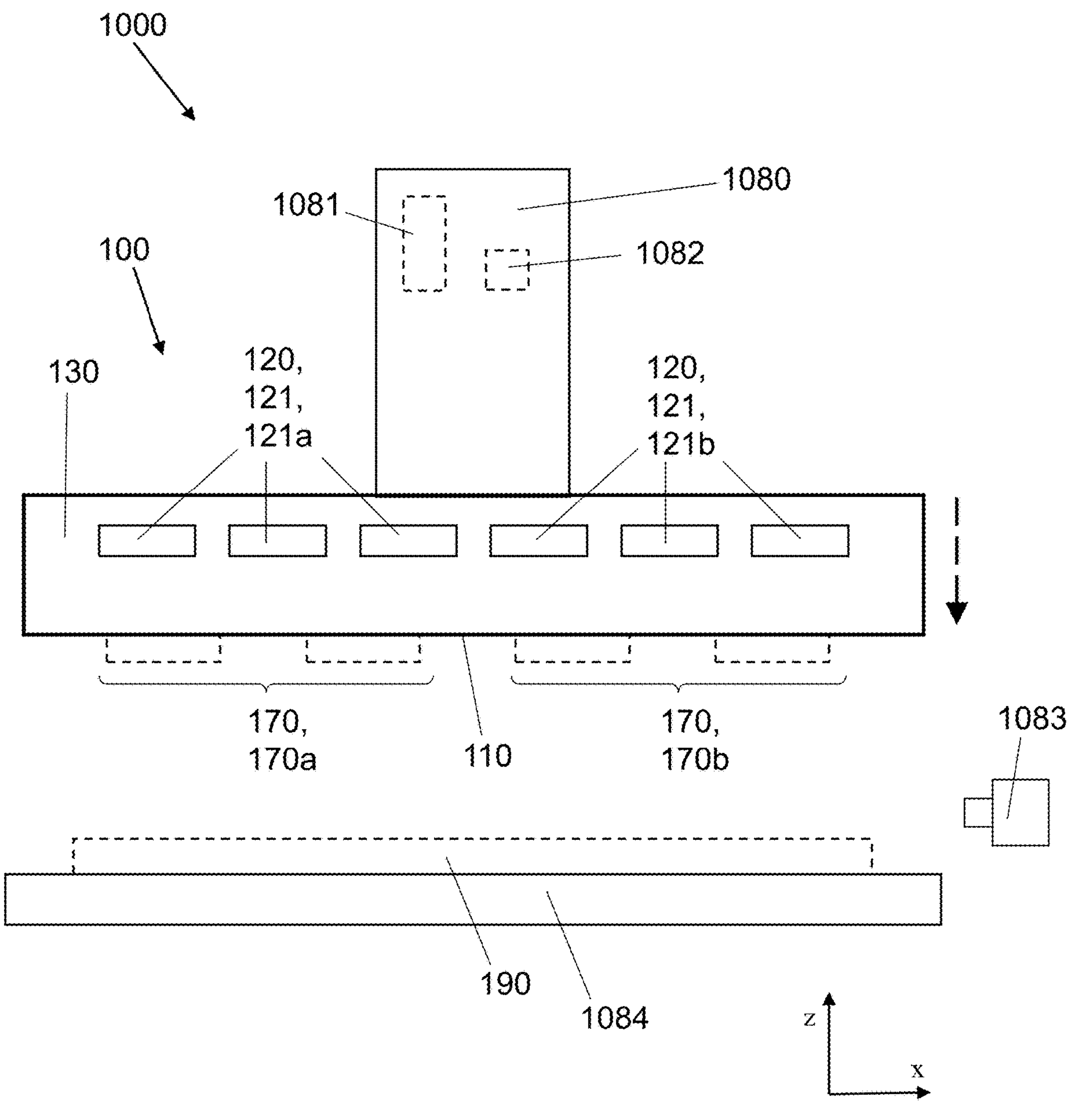
FIG. 1A is a schematic side view depicting a handling assembly moved towards a target workpiece, according to various aspects.

Aspects described below in the context of the apparatus are analogously valid for the respective methods, and vice versa. Furthermore, it will be understood that the aspects described below may be combined, for example, a part of one aspect may be combined with a part of another aspect.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

Various aspects generally relate to an apparatus, a device, or a carrier (e.g. corresponding to a "handling assembly", described in detail later) capable of employing electrostatic force for handling semiconductor components. Particularly, the apparatus (e.g. handling assembly) may include a body as well as an electrostatic generation unit (e.g. an electrode arrangement) configured to generate the electrostatic force. The electrostatic force generated by the apparatus may be powerful enough to securely grasp (e.g. hold) and support numerous semiconductor components, which may range from tens to hundreds of semiconductor components, simultaneously.

Furthermore, the apparatus, particularly its electrostatic generation unit, may be capable of generating a plurality of distinct electrostatic forces over or across or at a plurality of discrete and non-overlapping zones (e.g. component-handling regions) of a surface (e.g. a component-handling surface) of the body, for holding or retaining the semiconductor components thereto. Each electrostatic force over or at each zone of the surface of the body may be specifically tailored to hold a sub-set of the semiconductor components (e.g. corresponding to a "semiconductor component arrangement", described in detail later). Moreover, the electrostatic generation unit may be capable of generating and providing these electrostatic forces independently over each zone.

Consequently, the apparatus may be positioned over a target workpiece, such as a semiconductor substrate (e.g. a wafer, package, composite reconstructed wafer, etc.), on which the semiconductor components are intended to be placed, with the surface of the body of the apparatus (i.e. where the semiconductor components are held) facing the target workpiece. The apparatus itself may maintain a distance from the target workpiece to prevent any compression or application of mechanical forces to the semiconductor components. For instance, the semiconductor components held on the surface of the body of the apparatus may be touching (e.g. lightly touching) an upper surface of the target workpiece or be situated slightly above it.

To release the semiconductor components onto the target workpiece, the electrostatic generation unit may discharge, discontinue, or halt the generation of the electrostatic force or reduce its magnitude to a level insufficient for holding and retaining the semiconductor components on the surface of the body of the apparatus. Consequently, the semiconductor components are released (or detached) from the surface of the body of the apparatus and descend onto the target workpiece under the influence of gravity. According to various aspects, the electrostatic generation unit may be capable of selectively discontinuing the generation of the electrostatic force, or reducing its magnitude, over any one or more zone(s) of the surface of the body, to selectively release specific semiconductor components onto the target workpiece. As an example, a zone may be configured (e.g. shaped and/or sized) similarly to or as a "reticle" (e.g. a repeating portion), where all semiconductor components within the zone may be released together, at the same time (e.g. simultaneously). According to various aspects, the repeating portion (i.e. "reticle") may be tailored (e.g. shaped and/or sized) to a desired final product. As other examples, a zone may match the total area of an upper surface of the target workpiece (e.g. an upper surface of a wafer) or possess a particular shape and/or size relative to the upper surface of the target workpiece.

Accordingly, according to various aspects, the apparatus may function analogously to a "bond head" or "bond nozzle" in a pick-and-place equipment or system.

FIG. 1A is a schematic side view depicting a handling assembly moved towards a target workpiece, according to various aspects.

Figure 1B:
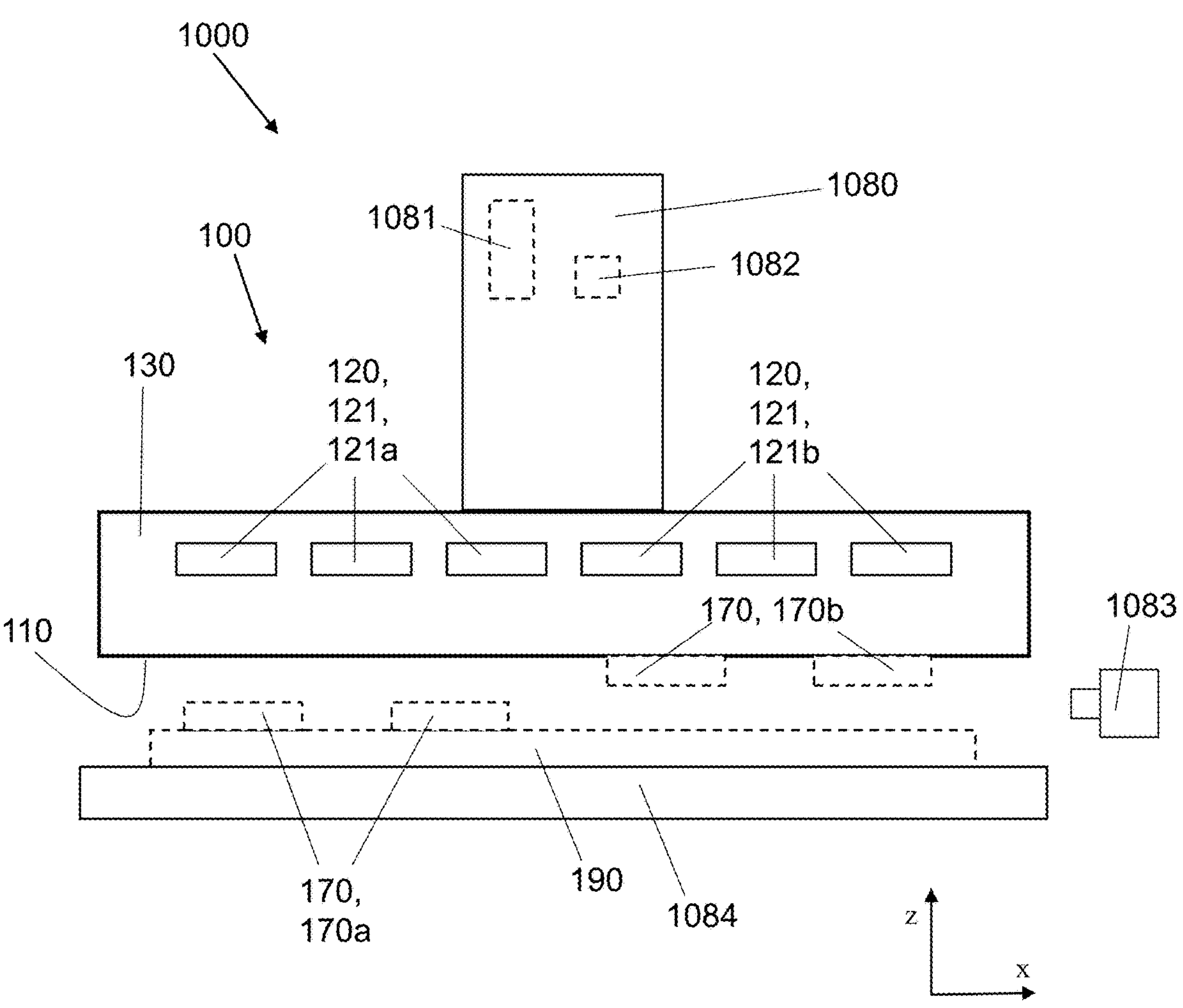
FIG. 1B is a schematic side view of the handling assembly of FIG. 1A releasing a first semiconductor component arrangement onto the target workpiece, according to various aspects.

FIG. 1B is a schematic side view of the handling assembly of FIG. 1A releasing a first semiconductor component arrangement onto the target workpiece, according to various aspects.

Figure 1C:
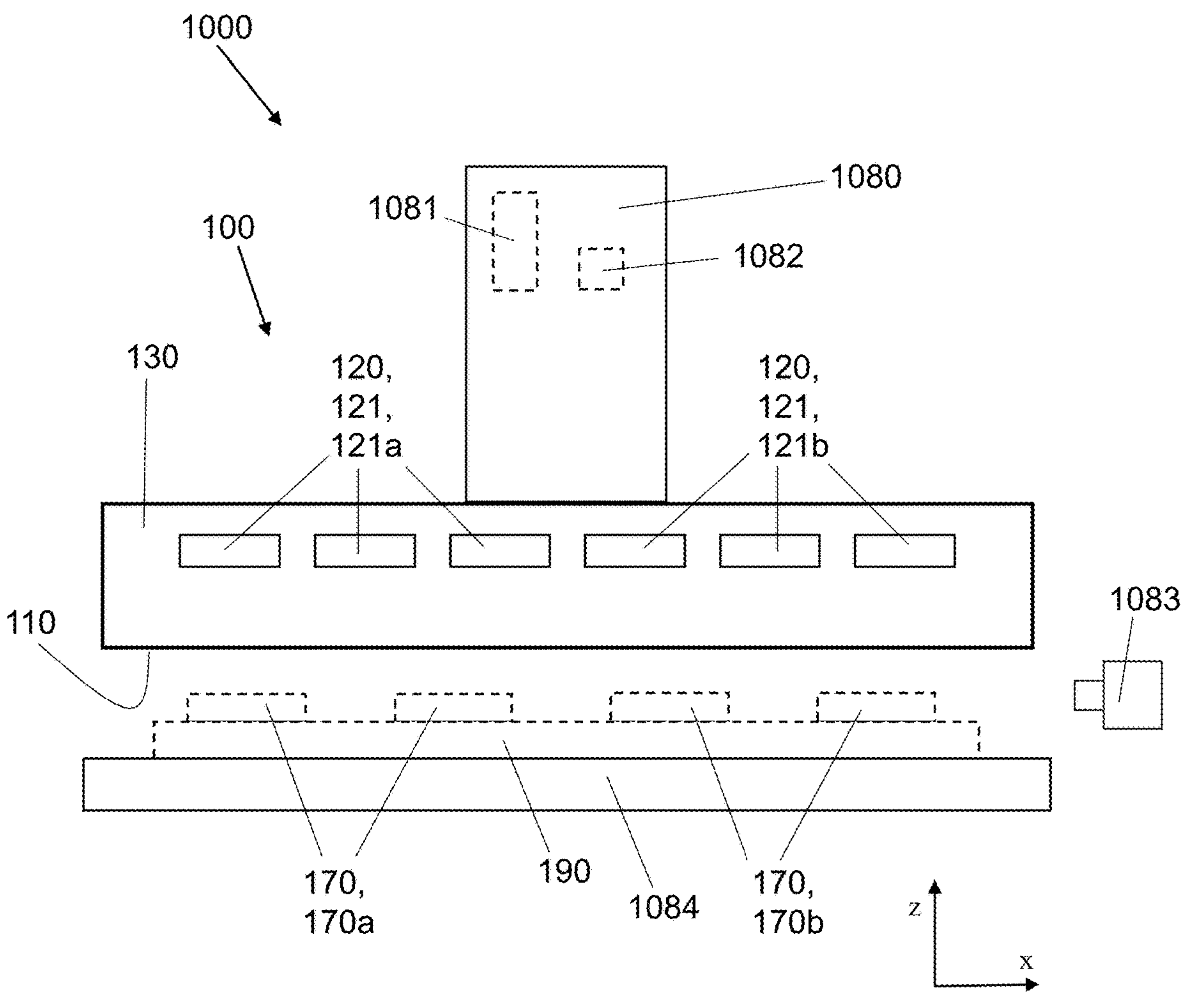
FIG. 1C is a schematic side view of the handling assembly of FIG. 1A releasing a second semiconductor component arrangement onto the target workpiece, according to various aspects.

FIG. 1C is a schematic side view of the handling assembly of FIG. 1A releasing a second semiconductor component arrangement onto the target workpiece, according to various aspects.

According to various aspects, there may be provided an apparatus which may include or may be the handling assembly 100.

The handling assembly 100 may be configured to perform at least any one or more of the following operations: picking up or lifting one or more (e.g. tens, hundreds, thousands, etc.) semiconductor components (e.g. simultaneously), holding or retaining or carrying the one or more semiconductor components (e.g. simultaneously), transporting the one or more semiconductor components between different locations (e.g. simultaneously), and/or selectively or independently releasing any or more of these one or more semiconductor components (e.g. simultaneously). These operations may be performed through the regulation of an electrostatic force (or field) generated by the handling assembly 100, as described in further detail later. Accordingly, according to various aspects, the handling assembly 100 may be an electrostatic handling device or an electrostatic carrier, capable of handling or carrying one or more semiconductor components.

According to various aspects, the semiconductor components may include any one or a combination of the following: die(s), chip(s), chiplet(s), processor(s), transistor(s), core(s), interposer(s), etc., or any other semiconductor components. According to various aspects, these semiconductor components may have similar shape(s) and/or size(s) (e.g. dimensions) as, or differing shape(s) and/or size(s) from, one another. Furthermore, these semiconductor components may be organized into several "groups" or "arrangements", each of which may be referred to as a "semiconductor component arrangement" 170. Each semiconductor component arrangement 170 may include an arrangement of one or more discrete semiconductor components.

Referring to FIG. 1A to FIG. 1C, the handling assembly 100 may be configured to interact and/or engage with a plurality of (in other words, two or more) semiconductor component arrangements 170. For ease of illustration, various aspects may be described with reference to the handling assembly 100 interacting and/or engaging with a first semiconductor component arrangement 170*a* and a second semiconductor component arrangement 170*b*. Nevertheless, it is envisaged that, in other implementations, the handling assembly 100 may be configured to interact with any other number of (e.g. three, four, or more) semiconductor component arrangements 170.

According to various aspects, the handling assembly 100 may include a body 130. The body 130 of the handling assembly 100 may be configured to accommodate or house one or more components (e.g. electrical components, mechanical components, etc.) of the handling assembly 100. The body 130 may include a surface 110 for interacting and/or engaging with the semiconductor components of the semiconductor component arrangements 170. Accordingly, the surface 110 may be referred to as a "component-handling surface" 110. According to various aspects, when the component-handling surface 110 is interacting and/or engaging with the semiconductor component arrangements 170, the semiconductor components of the semiconductor component arrangements 170 may be over or on (e.g. directly or indirectly over or on) the component-handling surface 110 of the body 130. Accordingly, as depicted in FIG. 1A to FIG. 1C, the component-handling surface 110 may be a bottom surface of the body 130 of the handling assembly 100, specifically when the component-handling surface 110 is directed towards or facing an underlying target workpiece 190.

According to various aspects, the component-handling surface 110 may be, but is not limited to being, a planar (e.g. a flat or a level) or substantially planar surface of the body 130 of the handling assembly 100. It is envisaged that, in other implementations, the component-handling surface 110 may be non-planar, for instance, to match an upper surface of a target workpiece 190. For example, in other implementations, the component-handling surface 110 may be curved (e.g. taking on a concave or convex shape), or may include a stepped cavity, a recess, or a receptacle (e.g. to accommodate a protrusion on the upper surface of the target workpiece 190), etc.

According to various aspects, the component-handling surface 110 may include, or, specifically, may be segmented, sectioned, or divided into a plurality of component-handling regions 111 (e.g. sections, portions, segments, zones, etc.) (see, for example, FIG. 1D). According to various aspects, the plurality of component-handling regions 111 may be distinct and non-overlapping regions of the component-handling surface 110. Each component-handling region 111 may be configured (e.g. may be shaped and/or sized, e.g. dimensioned) to accommodate a respective or corresponding semiconductor component arrangement 170, with the respective or corresponding semiconductor component arrangement 170 situated or disposed within its boundaries (e.g. within the border, perimeter, etc., of the component-handling region 111). As an example, each component-handling region 111 may be tailored (e.g. may be configurable or reconfigurable) to (or based on) a product chiplet size, number, etc., or product chiplet design (e.g. chiplet layout, size, distribution, etc.). Hence, a size of each component-handling region 111 may be larger than or equal (e.g. substantially equal) to a size (e.g. the total surface area or footprint) of a corresponding semiconductor component arrangement 170 that the component-handling region 111 is configured to accommodate. For ease of illustration, various aspects may be described with reference to the component-handling surface 110 having a first component-handling region and a second component-handling region. Nevertheless, it is envisaged that, in other implementations, the component-handling surface 110 may have one or more additional or other component-handling region(s) 111 (e.g. a third component-handling region 111*c*, or more component-handling region(s) 111). It is also envisaged that a size of the body 130 of the handling assembly 100, or at least the component-handling surface 110 of the body, may be tailored to a product chiplet size, number, etc., or product chiplet design (e.g. chiplet layout, size, distribution, etc.).

According to various aspects, the handling assembly 100 may include (e.g. further include) an electrode arrangement 120 configured to generate electrostatic forces (or fields) for, respectively, holding or retaining the semiconductor component arrangements 170 to or on the component-handling regions 111 of the component-handling surface 110 of the body 130 of the handling assembly 100.

According to various aspects, the electrode arrangement 120 may be disposed (e.g. positioned) at or relative to the body 130 (e.g. distributed across the body 130, and/or arranged in a pattern), and/or may be configured, in a manner so as to be capable of independently toggling each component-handling region 111 (e.g. each of the first component-handling region and the second component-handling region), of the component-handling surface 110, between an "active state" and an "inactive state". During the active state of a respective component-handling region 111 (e.g. the first component-handling region or the second component-handling region), the electrode arrangement 120 may be generating and providing a respective (or a specifically calibrated) electrostatic retention force over or at that component-handling region 111. Conversely, to shift that component-handling region 111 to the inactive state, the electrode arrangement 120 may discharge or discontinue (e.g. cease) the generation of the electrostatic retention force, or reduce the electrostatic retention force to a lower magnitude, rendering it insufficient for holding and retaining a corresponding semiconductor component arrangement 170 on or to that component-handling region 111.

According to various aspects, the electrode arrangement 120 may include at least one (in other words, one or more) positive electrode and at least one negative electrode. According to various aspects, each "positive electrode" may be an "electrode" configured to attain a positive charge (or positive bias) when it is polarized, activated, or in operation. This may take place when a corresponding power or voltage, such as a positive voltage (e.g. referenced to ground), is supplied or applied to the electrode. In a similar vein, each "negative electrode" may be an "electrode" configured to attain a negative charge (or negative bias) when it is polarized, activated, or in operation. This may take place when a corresponding power or voltage, such as a negative voltage (e.g. referenced to ground), is supplied or applied to that electrode.

According to various aspects, the at least one positive electrode and the at least one negative electrode may be concurrently polarized or activated or operated to generate and provide a "balanced" (or substantially "balanced") electrostatic retention force. This "balanced" electrostatic retention force, stemming from both the positive and negative electrodes, may result in a corresponding semiconductor component arrangement 170, which is held on the component-handling surface 110 of the body 130 by said balanced" electrostatic retention force, being electrostatically neutral. In other words, the cooperative action of the positive and the negative electrodes may result in an equilibrium of forces (or balance of forces) or a net neutral charge (e.g. substantially net neutral charge) on the corresponding semiconductor component arrangement 170 held on the component-handling surface 110. Consequently, when the corresponding semiconductor component arrangement 170 is released or detached from the component-handling surface 110, it may be electrostatically neutral.

According to various aspects, the electrode arrangement 120 may include a plurality of (in other words, two or more) positive electrodes as well as a plurality of negative electrodes. Specifically, the electrode arrangement 120 may be organized into a plurality of electrode sub-arrangements 121, with each electrode sub-arrangement 121 including at least one positive electrode (selected from the aforementioned plurality of positive electrodes) and at least one negative electrode (selected from among the aforementioned plurality of negative electrodes). For ease of illustration, various aspects may be described with the electrode arrangement 120 having a first electrode sub-arrangement 121*a* which includes at least one positive electrode and at least one negative electrode, and having a second electrode sub-arrangement 121*b* which includes at least one other positive electrode and at least one other negative electrode. Nevertheless, it is envisaged that, in other implementations, the electrode arrangement 120 may include any other number of electrode sub-arrangement(s) 121. Furthermore, it is envisaged that, in other implementations, the electrode arrangement 120 (or any electrode sub-arrangement(s) 121) may include only positive electrodes, or only negative electrodes.

According to various aspects, the first electrode sub-arrangement 121*a* may be disposed or positioned relative to the first component-handling region of the body 130, such that the electrode(s) of the first electrode sub-arrangement 121*a* may be aligned with (e.g. adjacent to and/or directly over) the first component-handling region of the body 130. This arrangement may enable the first electrode sub-arrangement 121*a* to generate and/or provide a first electrostatic retention force over (e.g. solely over) or at the first component-handling region to hold or retain the first semiconductor component arrangement 170*a* on (e.g. directly or indirectly on) the first component-handling region of the component-handling surface 110. Similarly, the second electrode sub-arrangement 121*b* may be aligned with the second component-handling region of the body 130 such that the second electrode sub-arrangement 121*b* may be capable of generating and/or providing a second electrostatic retention force over or at the second component-handling region to hold or retain the second semiconductor component arrangement 170*b* on the second component-handling region of the component-handling surface 110.

According to various aspects, as an example, the first electrostatic retention force may be of a same magnitude (or strength) as the second electrostatic retention force. In this configuration, the first electrostatic retention force may be calibrated to hold or retain the first semiconductor component arrangement 170*a* which may have a weight (e.g. a combined weight) similar to or the same as the second semiconductor component arrangement 170*b*.

As another example, the first electrostatic retention force may be of a different magnitude (or strength) than the second electrostatic retention force. For instance, the first electrostatic retention force may be of a smaller (or weaker) magnitude than the second electrostatic retention force. In this configuration, the first electrostatic retention force may be calibrated to hold or retain the first semiconductor component arrangement 170*a* which may be lighter than the second semiconductor component arrangement 170*b*. Conversely, as another example, the first electrostatic retention force may be of a larger (or stronger) magnitude than the second electrostatic retention force, calibrated to hold or retain the first semiconductor component arrangement 170*a* which may be heavier than the second semiconductor component arrangement 170*b*. Moreover, as another example, by having the first electrostatic retention force being of a different magnitude (or strength) from the second electrostatic retention force, the handling assembly 100 may be configured to hold different types of semiconductor component arrangements 170. In other words, a type of the semiconductor component arrangement 170*a* may differ from a type of the semiconductor component arrangement 170*b*. It is envisaged that, in other implementations, even with the first electrostatic retention force being of a same magnitude (or strength) as the second electrostatic retention force, the handling assembly 100 may likewise be configured to hold different types of semiconductor component arrangements 170.

According to various aspects, the handling assembly 100 (or handling assembly 200, 300, 400, or 500, described in detail later with reference to FIG. 2 to FIG. 5A) may be part of a handling system 1000. The handling system 1000 may include a movement assembly 1080 (e.g. a manipulator, pick and place tool, bonding tool, semiconductor processing tool, deposition tool, etc.) which may be coupled (e.g. removably coupled or permanently coupled), connected (e.g. detachably connectable or permanently connected), or affixed to the handling assembly 100. As an example, the handling assembly 100 (e.g. in the form of, composed of, or resembling a wafer, an electrostatic pick head, or an electrostatic chiplet carrier wafer, etc.) may be chucked onto (e.g. detachably connected to) the movement assembly 1080. According to various aspects, the movement assembly 1080 may be configured to move the handling assembly 100 (e.g. translationally, rotationally, etc.).

As an illustration, the movement assembly 1080 may orient the handling assembly 100 in a manner such that the component-handling surface 110 of the handling assembly 100 faces upwards. This orientation of the component-handling surface 110 may allow placement of the first semiconductor component arrangement 170*a* and/or the second semiconductor component arrangement 170*b* onto the component-handling surface 110, for example, using a robotic arm or any mechanism for picking and placing the semiconductor component arrangement(s) 170 onto the component-handling surface 110. It is envisaged that, in other implementations, the handling assembly 100 may directly pick or lift semiconductor component(s) of semiconductor component arrangement(s) 170 (e.g. from an external tray or a wafer carrier), by employing the electrostatic retention force(s). Subsequently, the movement assembly 1080 may orient the handling assembly 100 such that the component-handling surface 110 of the handling assembly 100 faces downwards (e.g. directing it towards the underlying target workpiece 190). The movement assembly 1080 may also be capable of moving the handling assembly 100 (e.g. translationally and/or vertically) towards the target workpiece 190, or away from the target workpiece 190. Additionally, the movement assembly 1080 may perform lateral movements of the handling assembly 100 (e.g. horizontally, along a reference plane which may be substantially parallel with the upper surface of the target workpiece 190).

According to various aspects, the handling system 1000 may include (e.g. further include) an alignment unit 1083. The alignment unit 1083 may include a sensor (e.g. an optical sensor, machine vision, vision system, etc.) configured to identify "alignment marks" (see, for example, references 112 in FIG. 1L) on the handling assembly 100 for determining a position and orientation of the handling assembly 100 (e.g. relative to the target workpiece 190). The alignment unit 1083 may be configured to process data collected by its sensor, which reveals the position and orientation of the handling assembly 100, and collaborate with the movement assembly 1080 to ensure that the handling assembly 100 is correctly positioned over the target workpiece 190 (e.g. which may involve maintaining a predetermined gap or distance from the target workpiece 190).

According to various aspects, the handling system 1000 may include (e.g. further include) a power source 1081 configured to supply power to the movement assembly 1080 and/or to electrical component(s) of the handling assembly 100 (e.g. to the electrode arrangement 120 of the handling assembly 100).

According to various aspects, the handling system 1000 may include (e.g. further include) a controller 1082 configured to control the movement assembly 1080 and/or to control the handling assembly 100. For example, the controller 1082 may be configured to control movement of the movement assembly 1080 and/or control one or more components (e.g. control the electrode arrangement 120) of the handling assembly 100.

According to various aspects, the handling system 1000 may include (e.g. further include) a substrate holder 1084 configured to support or hold the target workpiece 190.

Figure 1D:
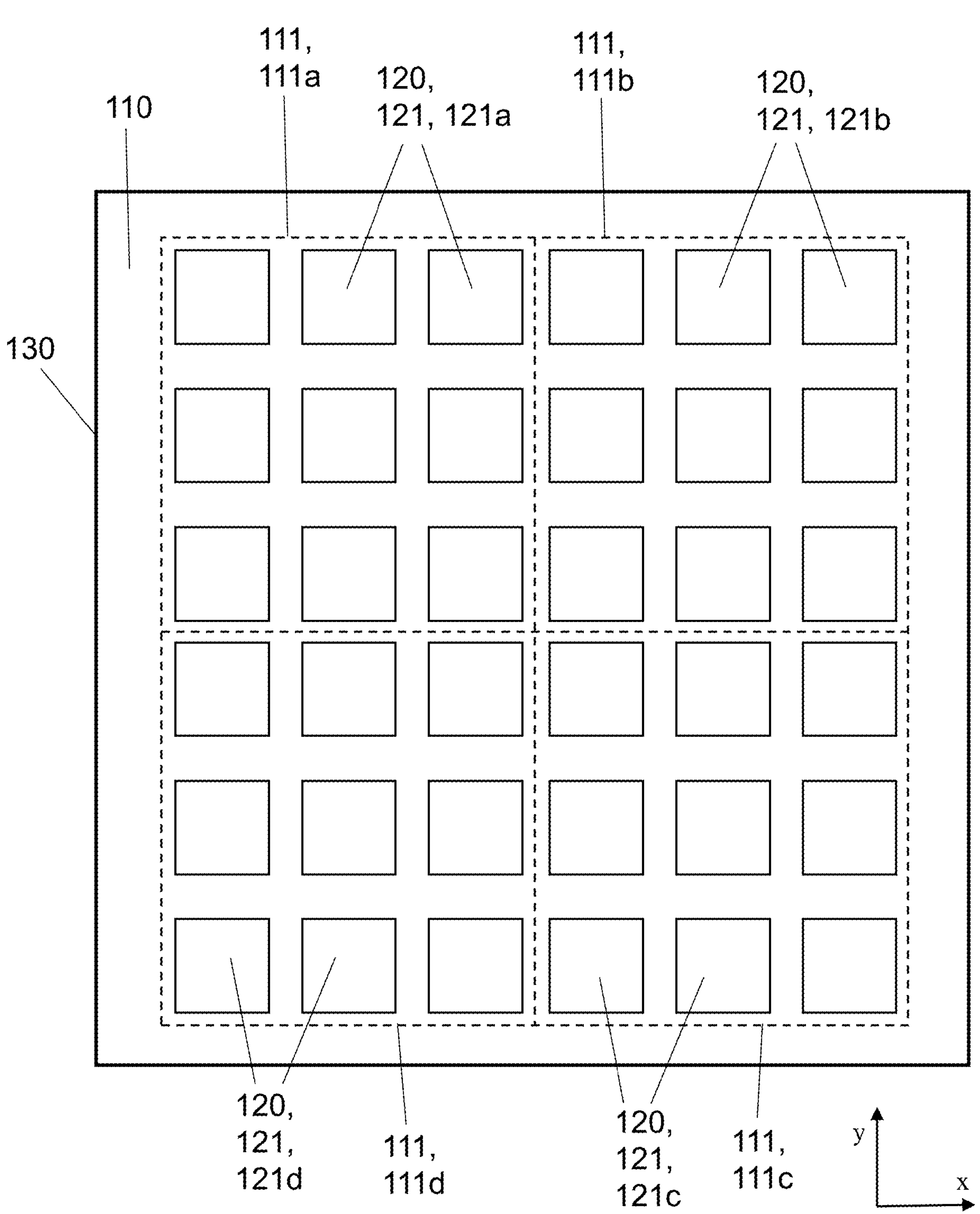
FIG. 1D is a schematic plan view of a component-handling surface and an electrode assembly of the handling assembly of FIG. 1A, according to a first implementation.

FIG. 1D is a schematic plan view of the component-handling surface and the electrode assembly of the handling assembly of FIG. 1A, according to a first implementation.

According to various aspects, the body 130 of the handling assembly 100 may be configured in a manner so as to include a polygonal-shaped component-handling surface 110. As an example, depicted in FIG. 1D, the component-handling surface 110 may be square (or squarish) shaped. As some other examples, the component-handling surface 110 may be triangular-shaped, rectangular-shaped, hexagonal-shaped, or any other shape.

According to the first implementation, as depicted in FIG. 1D, the component-handling surface 110 may include a plurality of component-handling regions 111. As an example, as depicted in FIG. 1D, the component-handling may include four component-handling regions 111. The number of component-handling regions 111 depicted in FIG. 1D is merely an example, and the number of component-handling regions 111 may be different (e.g. two, three, five, or more than five) in other implementations.

According to various aspects, as depicted, the plurality of component-handling regions 111 may be similar or identical in shape and/or size to one another. It is envisaged that, in other implementations, the plurality of component-handling regions 111 may differ in shape and/or size from one another.

As depicted in FIG. 1D, the plurality of component-handling regions 111 may be adjoined to one another. Specifically, each set (e.g. each pair) of adjacent (e.g. immediately adjacent) or neighboring component-handling regions 111 may be adjoined such that they share at least one border.

According to various aspects, with reference to FIG. 1D, the electrode arrangement 120 may include a plurality of electrodes. Specifically, the plurality of electrodes may be organized into a plurality of electrode sub-arrangements 121. According to various aspects, the electrode arrangement 120 may include a number of electrode sub-arrangements 121 that is equal to a number of the component-handling regions 111. Accordingly, in the example of FIG. 1D, the handling assembly 100 may include four electrode sub-arrangements 121 for four component-handling regions 111.

According to various aspects, each electrode sub-arrangement 121 may be disposed and/or bounded within an area or region of the body 130 corresponding to and/or aligned with a corresponding component-handling region 111. Specifically, with reference to FIG. 1D, a first electrode sub-arrangement 121*a* may be disposed and/or bounded within a first area or region of the body 130 corresponding to and/or aligned with a first component-handling region 111*a* of the component-handling surface 110. A second electrode sub-arrangement 121*b* may be disposed and/or bounded within a second area or region of the body 130 corresponding to and/or aligned with a second component-handling region 111*b* of the component-handling surface 110. A third electrode sub-arrangement 121*c* may be disposed and/or bounded within a third area or region of the body 130 corresponding to and/or aligned with a third component-handling region 111*c* of the component-handling surface 110. Further, a fourth electrode sub-arrangement 121*d* may be disposed and/or bounded within a fourth area or region of the body 130 corresponding to and/or aligned with a fourth component-handling region 111*d* of the component-handling surface 110.

According to various aspects, each electrode sub-arrangement 121 may be operable or controllable independently to generate and/or provide a respective or independent electrostatic retention force (or field) over (in other words, that reaches across or propagates) or at its associated component-handling region 111. Consequently, each electrode sub-arrangement 121 may also be independently operated or controlled to discharge or discontinue (or cease) the electrostatic retention force. According to various aspects, the respective electrostatic retention force provided over or at a corresponding component-handling region 111 by the electrode sub-arrangement 121 may be contained solely within that component-handling region 111 (e.g. within the border(s) or perimeter of that component-handling region 111), without extending to other (e.g. adjacent) component-handling regions 111. As such, in the example of FIG. 1D, the first electrode sub-arrangement 121*a* may be configured to provide a first electrostatic retention force over (e.g. solely over) or at the first component-handling region 111*a* to or for retaining (e.g. retaining only) a first semiconductor component arrangement (e.g. one or more semiconductor components) on the first component-handling region 111*a*. The second electrode sub-arrangement 121*b* may be configured to provide a second electrostatic retention force over or at the second component-handling region 111*b* to or for retaining a second semiconductor component arrangement (e.g. one or more other semiconductor components) on the second component-handling region 111*b*. The third electrode sub-arrangement 121*c* may be configured to provide a third electrostatic retention force over or at the third component-handling region 111*c* to or for retaining a third semiconductor component arrangement (e.g. one or more other semiconductor components) on the third component-handling region 111*c*, and the fourth electrode sub-arrangement 121*d* may be configured to provide a fourth electrostatic retention force over or at the fourth component-handling region 111*d* to or for retaining a fourth semiconductor component arrangement (e.g. one or more other semiconductor components) on the fourth component-handling region 111*d*.

According to various aspects, each electrode sub-arrangement 121 may include a same or equal number of electrodes as other (e.g. remaining) electrode sub-arrangements 121 of the electrode arrangement 120, as depicted in FIG. 1D. The number of electrodes depicted in each electrode sub-arrangement 121 in FIG. 1D is merely an example, and the number of electrodes in each electrode sub-arrangement 121 may be different in other implementations. Thus, for example, in other implementations, the plurality of electrode sub-arrangements 121 of the electrode arrangement 120 may have a different number of electrodes from one another.

FIG. 1E to FIG. 1H depict various configurations of the electrodes in an electrode sub-arrangement, according to various aspects.

Figure 1E:
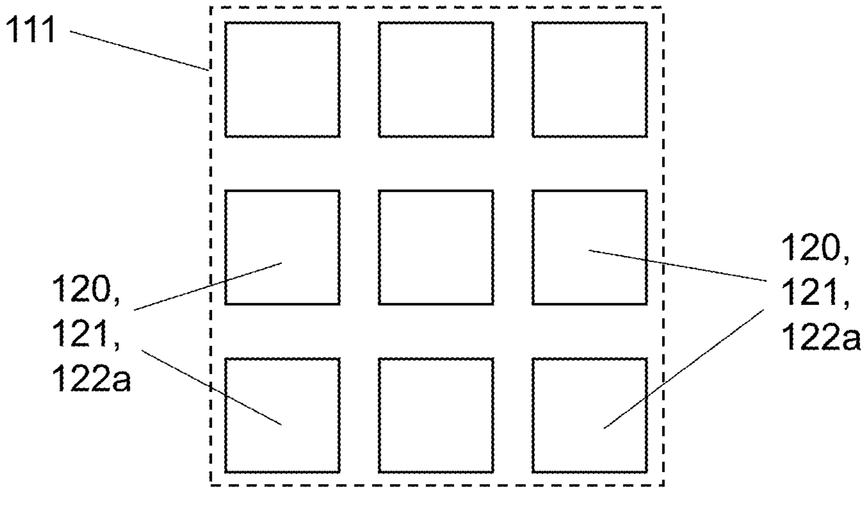
FIG. 1E to FIG. 1H depict various configurations of electrodes in an electrode sub-arrangement of the electrode assembly, according to various aspects.

Referring to FIG. 1E, as an example, according to various aspects, the electrode arrangement 120 may be configured such that any one, or more, or all (e.g. each) of the electrode sub-arrangement(s) 121 of the electrode arrangement 120 may include (e.g. solely include) a plurality of positive electrodes 122*a*.

The plurality of positive electrodes 122*a* may be configured to generate a (positive) electrostatic retention force over or at a respective (or associated) component-handling region 111. The (positive) electrostatic retention force may hold or retain a corresponding semiconductor component arrangement on or to the associated component-handling region 111. According to various aspects, when the semiconductor component arrangement is held or retained by the (positive) electrostatic retention force and, in turn, acquires a non-zero (e.g. a positive) electric potential from the (positive) electrostatic retention force, an ionizer or a static dissipative material that is grounded (not shown) may be employed to neutralize the potential of the semiconductor component arrangement, bringing it close to zero volts. In other words, the ionizer or static dissipative material may be configured to neutralize a charge which may be carried by the semiconductor component arrangement. According to various aspects, the ionizer or static dissipative material may be employed after the semiconductor component arrangement has been released from the handling assembly 100 (e.g. onto the underlying target workpiece 190). As an example, when static dissipative material (i.e. that is grounded) is employed, the static dissipative material may contact the semiconductor component arrangement (e.g. by touching its back surface) to dissipate any charge it may carry. As another example, the semiconductor component arrangement may be disposed onto a static dissipative chuck. It also is envisaged that a combination of both static dissipative material and ionizer may be employed.

Figure 1F:
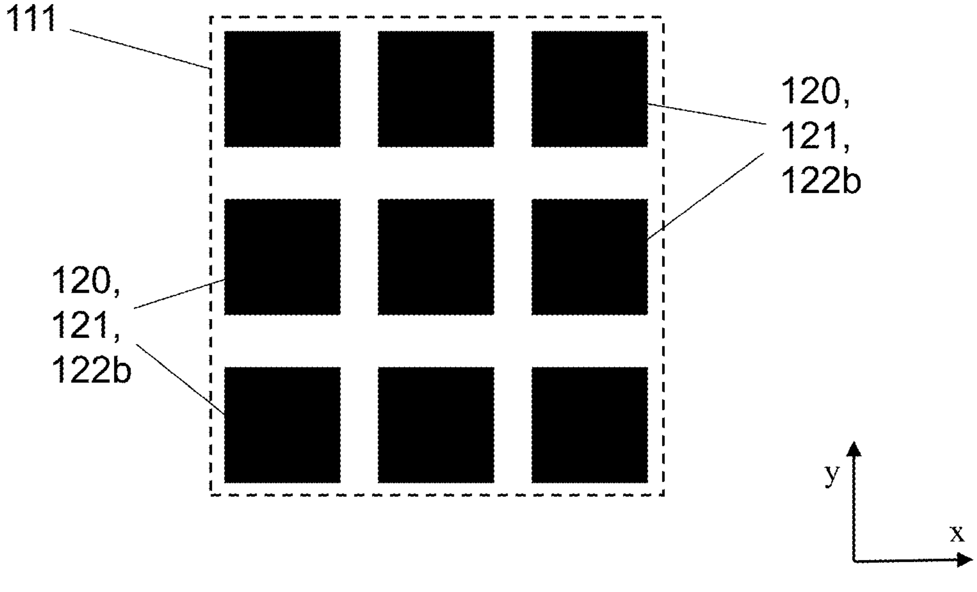

Referring to FIG. 1F, as another example, according to various aspects, the electrode arrangement 120 may be configured such that any one, or more, or all (e.g. each) of the electrode sub-arrangement(s) 121 of the electrode arrangement 120 may include (e.g. solely include) a plurality of negative electrodes 122*b*.

The plurality of negative electrodes 122*b* may be configured to generate a (negative) electrostatic retention force over or at a respective (or associated) component-handling region 111. The (negative) electrostatic retention force may hold or retain a corresponding semiconductor component arrangement on or to the associated component-handling region 111. According to various aspects, when the semiconductor component arrangement is held or retained by the (negative) electrostatic retention force and, in turn, acquires a non-zero (e.g. a negative) electric potential from the (negative) electrostatic retention force, the aforementioned ionizer or static dissipative material may be employed to neutralize the potential of the semiconductor component arrangement, bringing it close to zero volts.

Figure 1G:
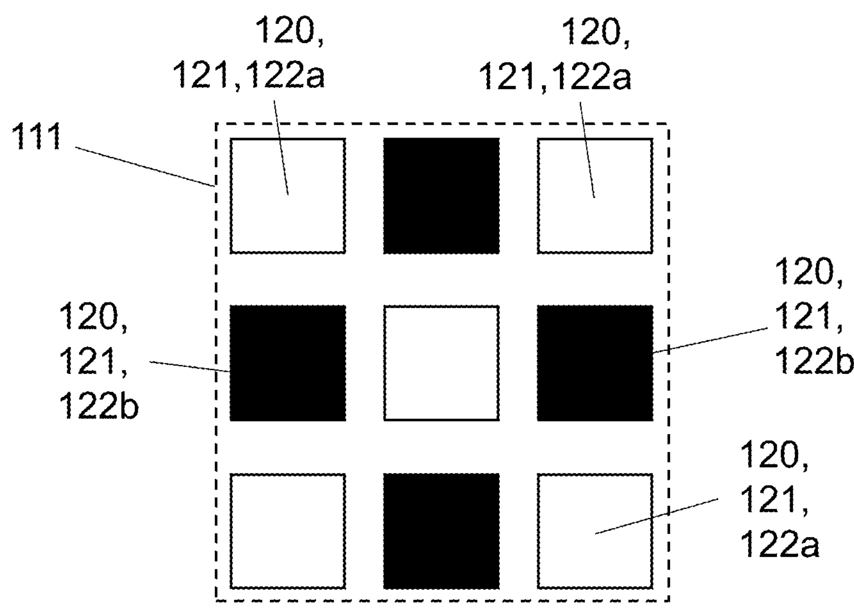
Figure 1H:
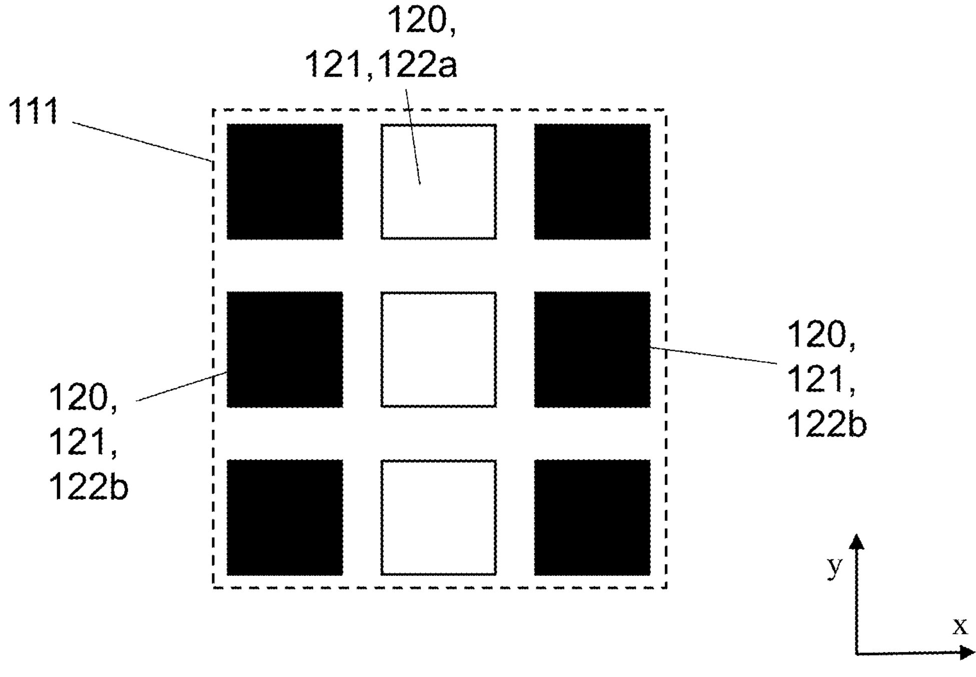

As yet another example, with reference to FIG. 1G and FIG. 1H, the electrode arrangement 120 may be configured such that any one, or more, or all (e.g. each) of the electrode sub-arrangement(s) 121 of the electrode arrangement 120 may include a combination or mixture of at least one positive electrode 122*a* and a least one negative electrode 122*b*. For instance, as depicted in FIG. 1G and FIG. 1H, each electrode sub-arrangement 121 may include a combination of a plurality of (e.g. two or more) positive electrodes 122*a* and a plurality of negative electrodes 122*b*.

According to various aspects, each electrode sub-arrangement 121 may include a different number of positive electrodes 122*a* than negative electrodes 122*b*. For example, referring to FIG. 1G, according to various aspects, the electrode sub-arrangement 121 may include a larger number of positive electrodes 122*a* than negative electrodes 122*b*. As another example, referring to FIG. 1H, according to various aspects, the electrode sub-arrangement 121 may include a smaller number of positive electrodes 122*a* than negative electrodes 122*b*. While FIG. 1G and FIG. 1H depict the electrode sub-arrangement 121 as including a different number of positive electrodes 122*a* than negative electrodes 122*b*, it is envisaged that, in other implementations, each electrode sub-arrangement 121 may be configured to include an equal number of positive electrodes 122*a* and negative electrodes 122*b*.

Referring to FIG. 1G, according to various aspects, the plurality of positive electrodes 122*a* and the plurality of negative electrodes 122*b* may be organized in an alternating fashion, corresponding to (or imitating) a checkered (or checkerboard) pattern. In this arrangement, each positive electrode 122*a* may be positioned next to one or more negative electrodes 122*b* in orthogonal directions along both a first width (e.g. along the x-axis) and a second width (e.g. along the y-axis) of the positive electrode 122*a*. Similarly, each negative electrode 122*b* may be adjacent to one or more positive electrodes 122*a* in orthogonal directions along the first width and the second width of the negative electrode 122*b*. Neighboring pairs of positive electrodes 122*a* may be next to one another, in a direction extending diagonally across the positive electrodes 122*a*. Likewise, neighboring pairs of negative electrodes 122*b* may be next to one another, in a direction extending diagonally across the negative electrodes 122*b*.

Referring to FIG. 1H, according to various aspects, the plurality of positive electrodes 122*a* and the plurality of negative electrodes 122*b* within an electrode sub-arrangement 121 may be organized in an alternating fashion, corresponding to (or imitating) groups of lines or a striped pattern. This arrangement may include alternating rows (or columns) of positive electrodes 122*a* and negative electrodes 122*b*. Specifically, a row (or column) of positive electrodes 122*a* may be adjacent (e.g. immediately adjacent) to a row (or column) of negative electrodes 122*b*.

Figure 1I:
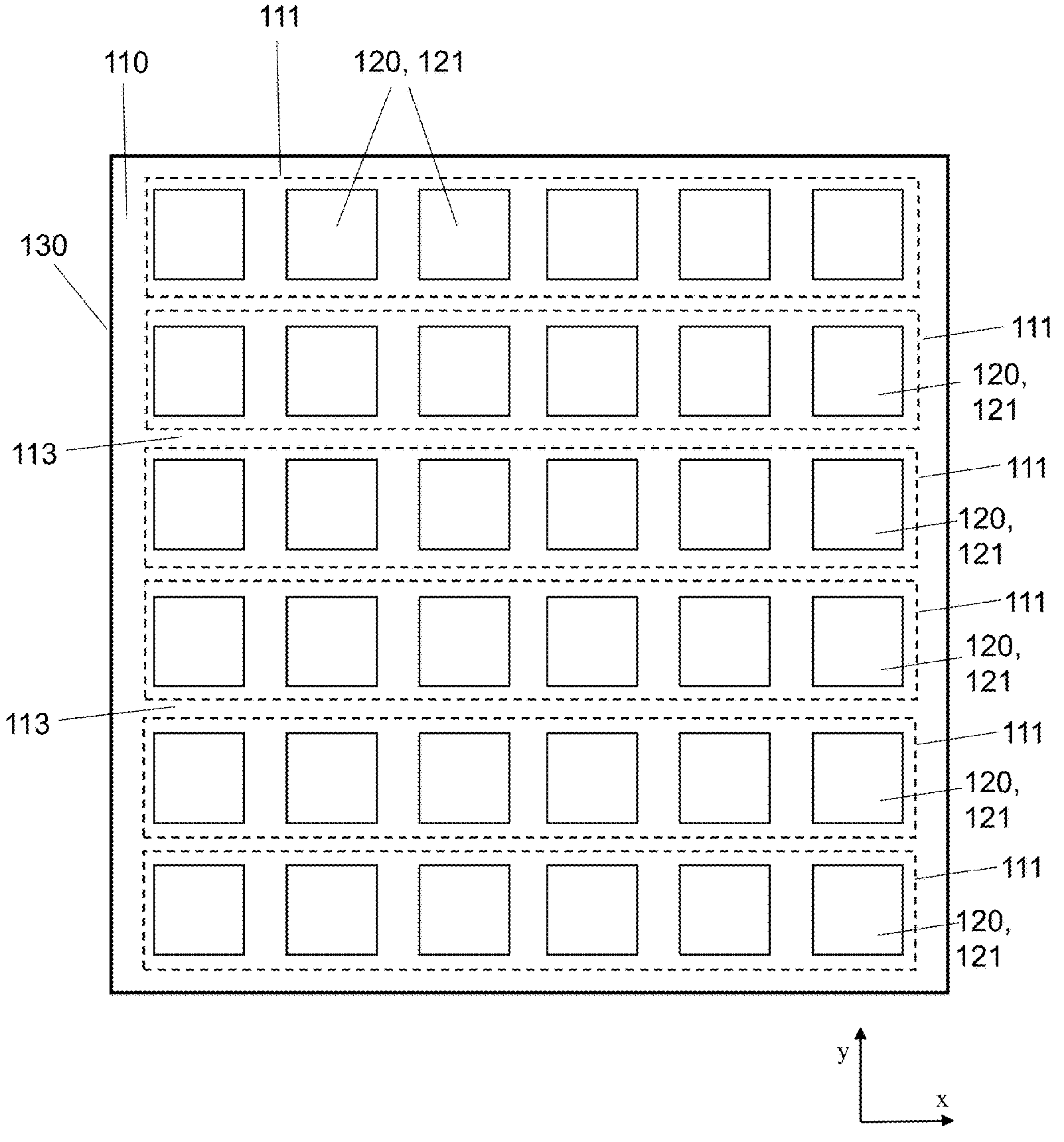
FIG. 1I is a schematic plan view of the component-handling surface and the electrode assembly of the handling assembly of FIG. 1A, according to a second implementation.

FIG. 1I is a schematic plan view of the component-handling surface and the electrode assembly of the handling assembly of FIG. 1A, according to a second implementation.

According to the second implementation, as depicted in FIG. 1I, the component-handling surface 110 may include a plurality of (e.g. six) component-handling regions 111 which are spaced apart from one another (e.g. by a gap or distance).

Specifically, with reference to FIG. 1I, the plurality of component-handling regions 111 may be spaced apart from one another at regular (or uniform or equal) intervals. That is, a spacing between every pair of neighboring component-handling regions 111 of the plurality of component-handling regions 111 may be constant or uniform. It is envisaged that, in other implementations, the plurality of component-handling regions 111 may be spaced apart from one another at irregular (or non-uniform or non-equal) intervals.

Additionally, referring to FIG. 1I, the component component-handling surface 110 may include at least one partitioning-portion 113 among and/or between the plurality of component-handling regions 111. Specifically, a respective partitioning-portion 113 may be interposed or sandwiched between each pair of neighboring component-handling regions 111. As an example, depicted in FIG. 1I, the component-handling surface 110 may have a unified partitioning-portion 113 which encircles each of the plurality of component-handling regions 111. While FIG. 1I illustrates the component-handling surface 110 having a unified partitioning-portion 113, it is envisaged that, in other implementations, the component-handling surface 110 may include any number, shape, size, etc., of partitioning-portion(s).

According to various aspects, the at least one partitioning-portion 113 may be configured to be free from or devoid of any electrostatic retention force (e.g. even when the electrode arrangement 120 is polarized, activated, or in operation, in other words, supplied with power or voltage).

Figure 1J:
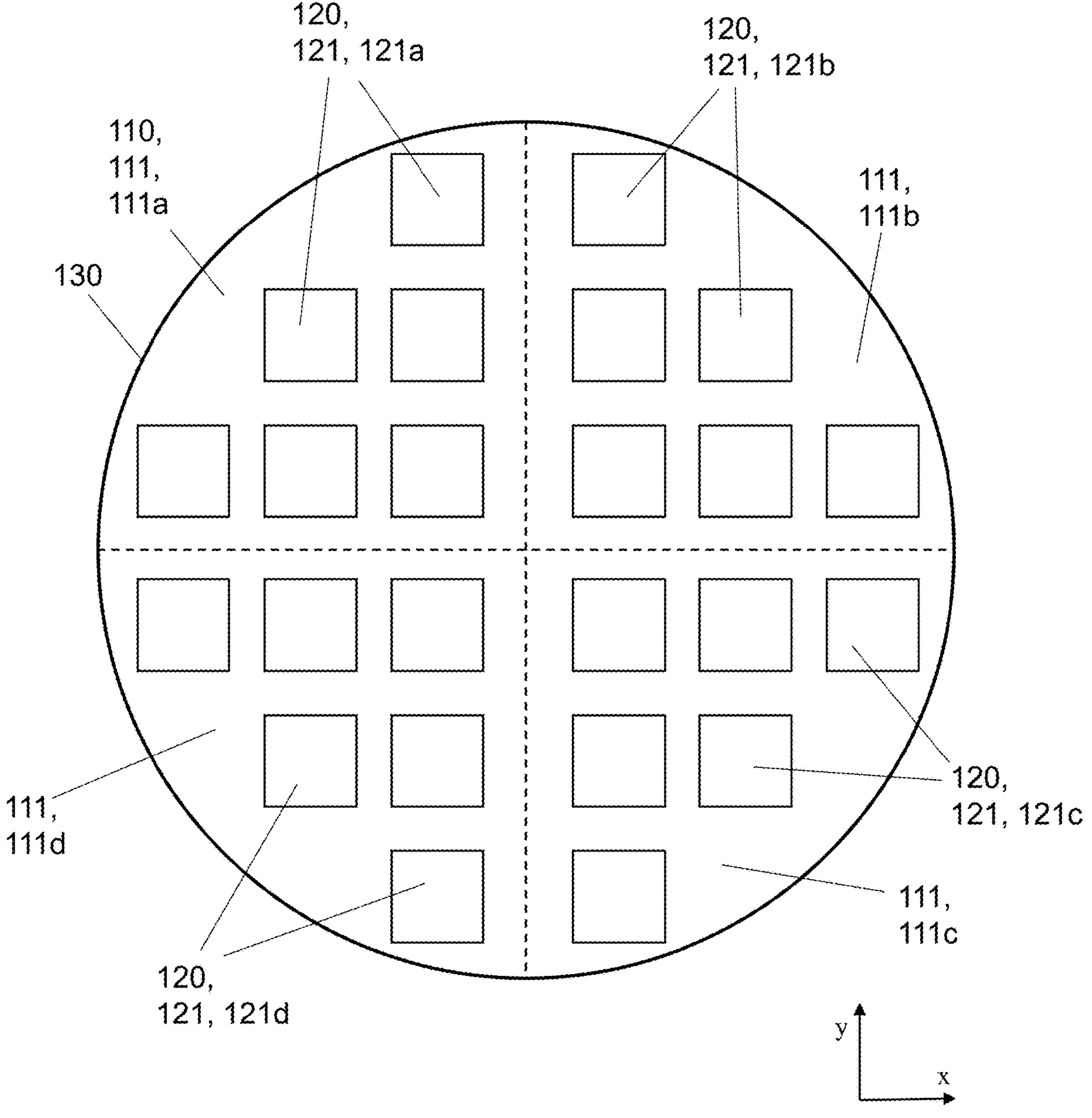
FIG. 1J is a schematic plan view of the component-handling surface and the electrode assembly of the handling assembly of FIG. 1A, according to a third implementation.

FIG. 1J is a schematic plan view of the component-handling surface and the electrode assembly of the handling assembly of FIG. 1A, according to a third implementation.

According to various aspects, the body 130 of the handling assembly 100 may be configured in a manner so as to include a curvilinear-shaped component-handling surface 110. As an example, depicted in FIG. 1J, the component-handling surface 110 may be circle (or circular) shaped. As some other examples, the component-handling surface 110 may be oval-shaped, ellipse-shaped, annular-shaped, arched-shaped, or any other shape (e.g. symmetrical or non-symmetrical shape).

Referring to FIG. 1J, according to the third implementation, the component-handling surface 110 may be evenly segregated or divided into a plurality of equally (or similarly) sized component-handling regions 111. Further, the component-handling surface 110 may not have (in other words, may be free of) any "partitioning-portion" 113. Hence, the combined or total area of the plurality of component-handling regions 111 may be equal to the total area of the component-handling surface 110 itself.

As an example, depicted in FIG. 1J, the component-handling surface 110 may be evenly divided into four component-handling regions 111. While FIG. 1J illustrates the component-handling surface 110 as being evenly divided into four quadrant-shaped component-handling regions 111, it is envisaged that, in other implementations, the component-handling surface 110 may be evenly divided into any other number (e.g. three, or eight, etc.) and/or other shape of component-handling regions 111.

With reference to FIG. 1J, the electrode arrangement 120 may include a plurality of electrode sub-arrangements 121. As depicted, each electrode sub-arrangement 121 may include a plurality of electrodes. According to various aspects, each electrode sub-arrangement 121 may include a same or equal number of electrodes as other (e.g. remaining) electrode sub-arrangements 121 of the electrode arrangement 120, as depicted in FIG. 1J. It is envisaged that, in other implementations, the plurality of electrode sub-arrangements 121 of the electrode arrangement 120 may have a different number of electrodes from one another. Furthermore, the number of electrodes depicted in each electrode sub-arrangement 121 in FIG. 1J is merely an example, and the actual number of electrodes in each electrode sub-arrangement 121 may be different in other implementations.

According to various aspects, each electrode sub-arrangement 121 may be operable or controllable independently to generate and/or provide a respective electrostatic retention force over or at its associated component-handling region 111. Consequently, each electrode sub-arrangement 121 may also be independently operated or controlled to discharge or discontinue (or cease) the electrostatic retention force. According to various aspects, the respective electrostatic retention force provided over or at a corresponding component-handling region 111 may be contained solely within that component-handling region 111 (e.g. within the border(s) or perimeter of that component-handling region 111), without extending to other (e.g. adjacent) component-handling regions 111. As such, in the example of FIG. 1J, the first electrode sub-arrangement 121*a* may be configured to provide a first electrostatic retention force over (e.g. solely over) or at the first component-handling region 111*a* to or for retaining (e.g. retaining only) a first semiconductor component arrangement (e.g. one or more semiconductor components) on the first component-handling region 111*a*. The second electrode sub-arrangement 121*b* may be configured to provide a second electrostatic retention force over or at the second component-handling region 111*b* to or for retaining a second semiconductor component arrangement (e.g. one or more other semiconductor components) on the second component-handling region 111*b*. The third electrode sub-arrangement 121*c* may be configured to provide a third electrostatic retention force over or at the third component-handling region 111*c* to or for retaining a third semiconductor component arrangement (e.g. one or more other semiconductor components) on the third component-handling region 111*c*, and the fourth electrode sub-arrangement 121*d* may be configured to provide a fourth electrostatic retention force over or at the fourth component-handling region 111*d* to or for retaining a fourth semiconductor component arrangement (e.g. one or more other semiconductor components) on the fourth component-handling region 111*d*.

Figure 1K:
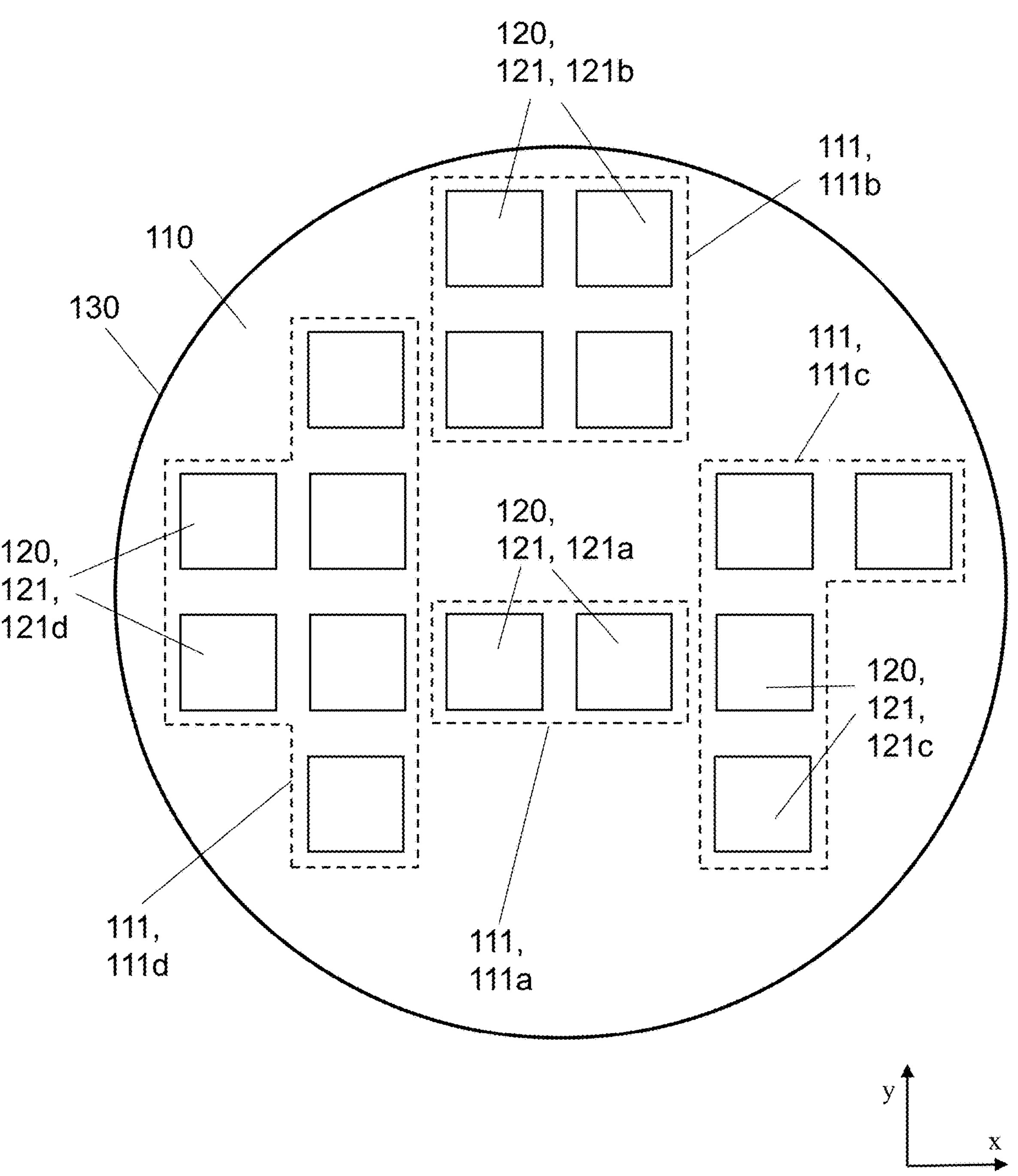
FIG. 1K is a schematic plan view of the component-handling surface and the electrode assembly of the handling assembly of FIG. 1A, according to a fourth implementation.

FIG. 1K is a schematic plan view of the component-handling surface and the electrode assembly of the handling assembly of FIG. 1A, according to a fourth implementation.

According to the fourth implementation, as depicted in FIG. 1K, the component-handling surface 110 may include a plurality of component-handling regions 111 of various (e.g. different) shapes and/or sizes. Specifically, at least one component-handling region 111 of the plurality of component-handling regions 111 may differ in shape and/or size from at least one other component-handling region(s) 111 of the plurality of component-handling regions 111. Each respective component-handling region 111 may have any shape (e.g. a polygonal shape, curvilinear shape, symmetrical shape, asymmetrical shape, regular shape, irregular shape, loop or annular shape, etc.) and/or any size on the component-handling surface 110. Furthermore, the plurality of component-handling regions 111 may be spaced apart from each other (e.g. at regular, or non-regular distances) on the component-handling surface 110, as depicted in FIG. 1K, or they may be adjoined to each other according to other implementations.

According to various aspects, the electrode arrangement 120 may include a plurality of electrode sub-arrangements 121 respectively associated or paired with the plurality of component-handling regions 111. As an example, as depicted in FIG. 1K, a first electrode sub-arrangement 121*a* that is associated or paired with a first component-handling region 111*a* of a smaller size than a second component-handling region 111*b* may have a smaller number of electrodes than a second electrode sub-arrangement 121*b* that is associated with the (larger-sized) second component-handling region 111*b*. As another example, a third electrode sub-arrangement 121*c* that is associated or paired with a third component-handling region 111*c* that is of a similar or same size as (albeit having a different shape from) the second component-handling region 111*b* may have a same or equal number of electrodes as the second electrode sub-arrangement 121*b* that is associated with the (similarly-sized) second component-handling region 111*b*. As yet another example, a fourth electrode sub-arrangement 121*d* that is associated or paired with a fourth component-handling region 111*d* that is of a larger size than the third component-handling region 111*c* may have a larger number of electrodes than the third electrode sub-arrangement 121*c* that is associated with the (smaller-sized) third component-handling region 111*c*. According to various aspects, a larger number of electrodes within an electrode sub-arrangement may correspond to a generation and provision of an electrostatic retention force over a larger area and/or an electrostatic retention force of a larger (or stronger) magnitude compared to another electrode sub-arrangement with a smaller number of electrodes.

Figure 1L:
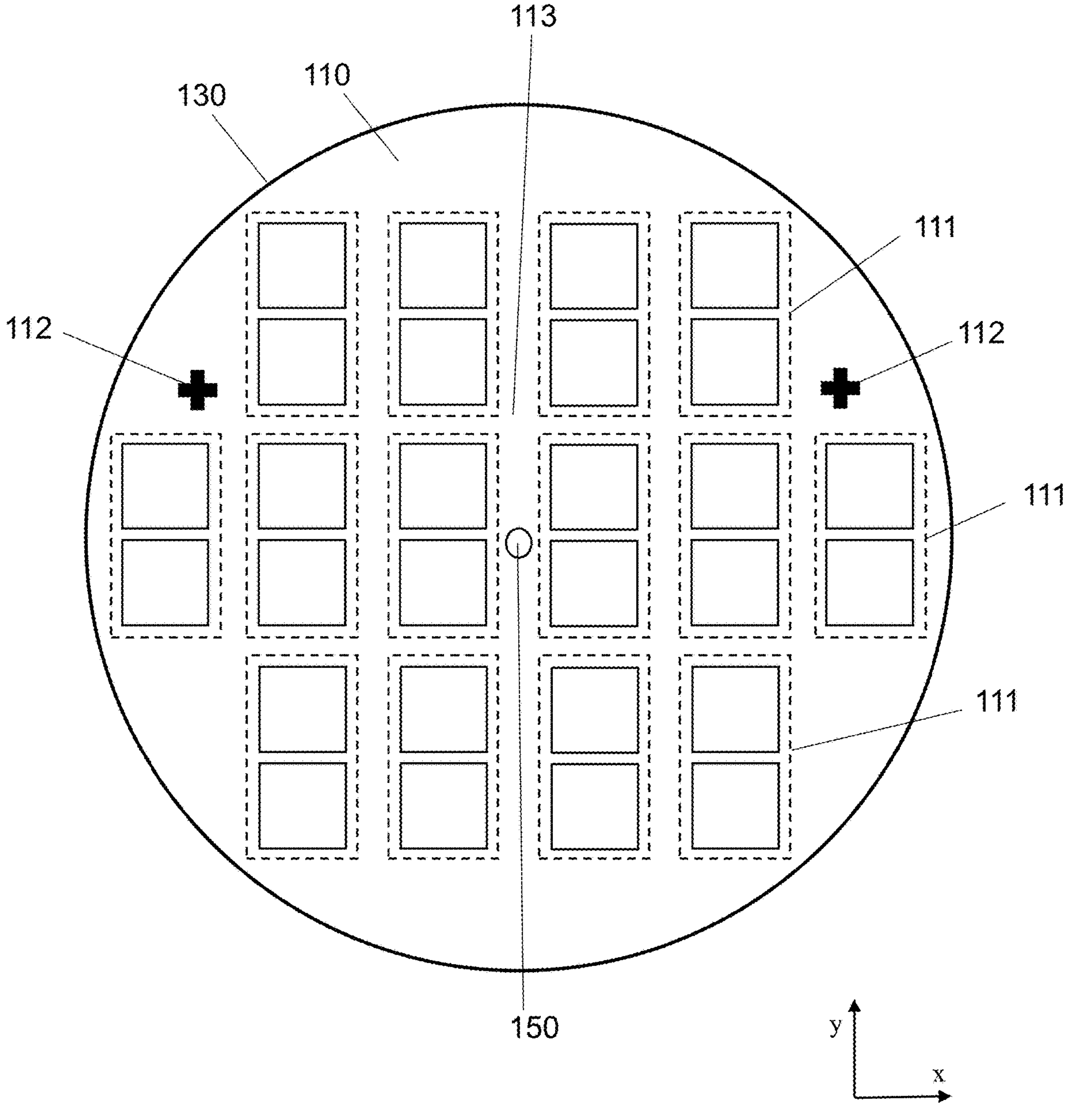
FIG. 1L is a schematic plan view of the component-handling surface and the electrode assembly of the handling assembly of FIG. 1A, according to a fifth implementation.

FIG. 1L is a schematic plan view of the component-handling surface and the electrode assembly of the handling assembly of FIG. 1A, according to a fifth implementation.

According to the fifth implementation, as depicted in FIG. 1L, the component-handling surface 110 may include a plurality of (e.g. fourteen) component-handling regions 111.

Further, the handling assembly 100 may include (e.g. optionally or further include) a sensor unit 150 on the component-handling surface 110.

The sensor unit 150 may include a proximity sensor, an optical sensor, a camera, etc., which be configured to sense an external environment of the handling assembly 100. For instance, the sensor unit 150 may be configured to sense (e.g. detect) external structures (e.g. the target workpiece 190, the substrate holder 1084, etc.).

According to various aspects, the sensor unit 150 (e.g. at least a lens of the sensor unit 150) may be disposed outside the boundaries of the plurality of component-handling regions 111, on the component-handling surface 110. For example, the sensor unit 150 may be at a partitioning-portion 113 of the component-handling surface 110, as depicted in FIG. 1L. In this manner, any semiconductor component arrangement held on any component-handling region 111 of the component-handling surface 110 may not obstruct the sensor unit 150.

According to various aspects, the component-handling surface 110 may include (e.g. further include) one or more alignment mark(s) 112. These alignment mark(s) 112 may be utilized (e.g. by the alignment unit 1083 of FIG. 1A) to determine a position and/or orientation of the handling assembly 100. According to various aspects, the alignment mark(s) 112 may be permanent alignment mark(s) 112 or they may be removable (e.g. temporary) alignment mark(s) 112. Furthermore, it is envisaged that the alignment mark(s) 112 may be any type of alignment mark(s) (e.g. of any shape and/or size) and may be disposed anywhere on the component-handling surface 110.

Figure 2:
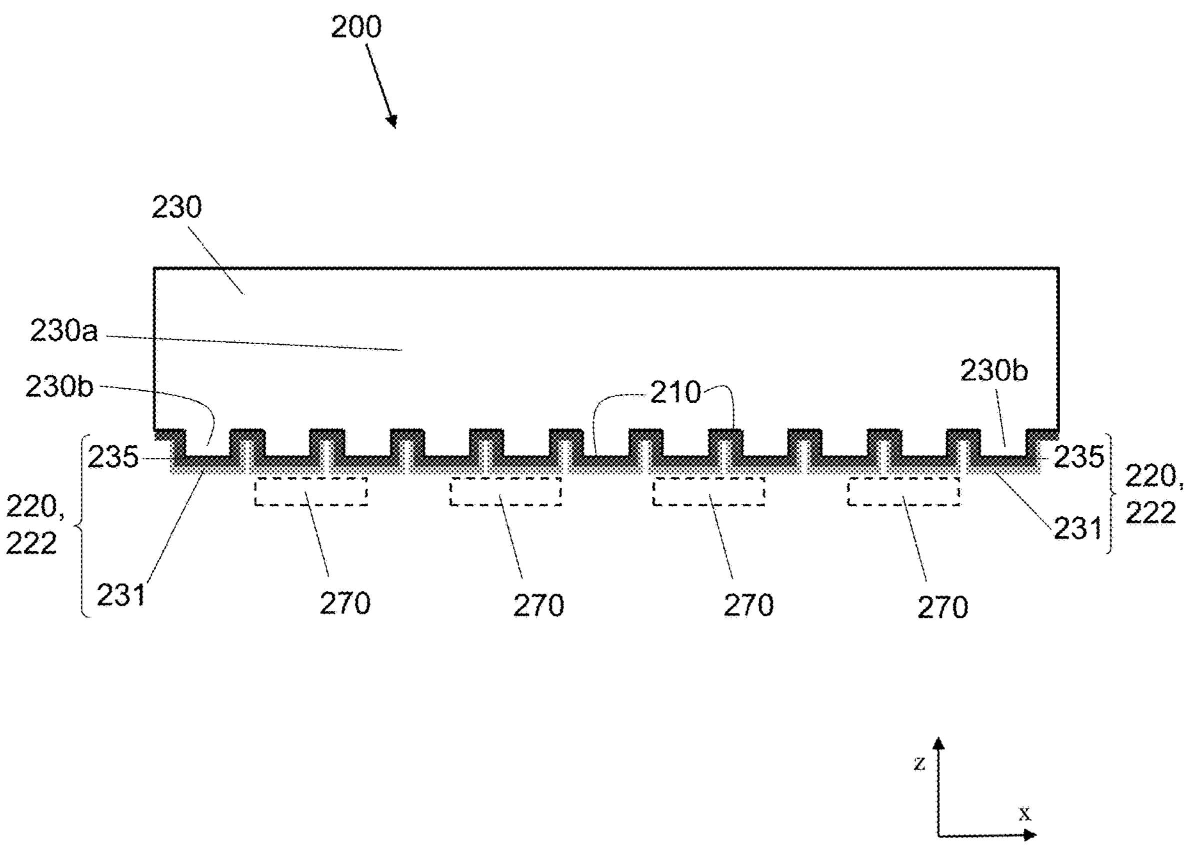
FIG. 2 is a schematic side view of a handling assembly which includes a body having a plurality of protruding portions, according to various aspects.

FIG. 2 is a schematic side view of a handling assembly which includes a body having a plurality of protruding portions, according to various aspects.

According to various aspects, there may be provided an apparatus which may include or may be the handling assembly 200. According to various aspects, the handling assembly 200 may contain any one or more or all the features and/or limitations of the handling assembly 100 of FIG. 1A. In the following, the handling assembly 200 is described with like reference characters generally referring to the same or corresponding parts/features of the handling assembly 100 of FIG. 1A. The description of the parts/features made with respect to the handling assembly 200 may also be applicable with respect to the handling assembly 100, and vice versa.

As in the handling assembly 100 of FIG. 1A, the handling assembly 200 may include a body 230 having a component-handling surface 210 for interacting and/or engaging with a plurality of semiconductor component arrangements 270.

As in the handling assembly 100 of FIG. 1A, the component-handling surface 210 of the handling assembly 200 may include a plurality of component-handling regions.

According to various aspects, the body 230 of the handling assembly 200 may include or may be composed of a semiconductor material or any other suitable material (e.g. silicon, silicon wafer, glass, glass wafer, metal, alloy, metal composite, polymer, plastic, plastic composite, fiber glass, etc.).

According to various aspects, the component-handling surface 210 of the body 230 may include a plurality of protruding portions 230*b*. As depicted in FIG. 2, the protruding portions 230*b* may be extending from a main portion 230*a* of the body 230. According to various aspects, the plurality of protruding portions 230*b* may include or may be composed of a same semiconductor material as the main portion 230*a* of the body 230. According to various aspects, the plurality of protruding portions 230*b* may be integrally formed with the main portion 230*a* of the body 230. For example, according to various aspects, a semiconductor material (e.g. silicon) which forms the main portion 230*a* of the body 230 may be further processed (e.g. patterned and/or etched) to form the plurality of protruding portions 230*b*. According to various aspects, the plurality of protruding portions 230*b* may be referred to as "pillars" of semiconductor material, specifically, "silicon pillars" when silicon is used to form the body 230. It is envisaged that, in other aspects, said "pillars" may be composed of any other suitable material, for example, glass, metal (e.g. pure metal, alloy or metal composite), polymer (e.g. plastic, plastic composite), fiber glass, etc.

According to various aspects, the handling assembly 200 may include (e.g. further include) an electrode arrangement 220. The electrode arrangement 220 may include a plurality of electrodes 222 which may include or may be formed of a metal layer 235 (or metal sheets/pads) (e.g. copper, titanium, aluminum, etc., or metal alloy) disposed on or over (e.g. directly on or over) each of the protruding portions 230*b* of the body 230. For instance, the body 230 may be patterned, etched, electroplated, etc., to deposit the metal layer 235 on the protruding portions 230*b* of the body 230.

According to various aspects, each protruding portion 230*b* may be covered by a distinct or individual metal layer 235 (or metal sheet/pad/line) (which may be separate or insulated or isolated from another metal layer 235, e.g. another metal sheet/pad, covering another protruding portion 230*b*), and each distinct or individual metal layer 235 (or metal sheet/pad/line) over each protruding portion 230*b* may be configured as (or may form) an individual electrode 222 of the electrode arrangement 220 of the handling assembly 200. Thus, a location of a protruding portion 230*b* (with the metal layer 235 or respective metal sheet/pad/line) on the component-handling surface 210 of the body 230 may correspond to a location of an individual electrode 222 of the electrode arrangement 220 on the component-handling surface 210 of the body 230.

According to various aspects, the metal layer 235 (or metal sheets/pads/lines) may have a uniform (or substantially uniform) thickness throughout. For example, the metal layer 235 (or metal sheets/pads/lines) may be a uniformly thick nano or micro layer (or sheets/pads/lines).

According to various aspects, the handling assembly 200 may be configured to be connectable to a power source (e.g. an external power source) (not shown) which may be capable of supplying power (e.g. positive and/or negative voltage(s)) to the metal layer 235 (or to each of the plurality of electrodes 222 formed of the metal layer 235). It is envisaged that, in other implementations, the handling assembly 200 may be part of a handling system (such as the handling system 1000 of FIG. 1A) which may include the power source 1081.

According to various aspects, the plurality of electrodes 222 may be arranged or organized into a plurality of electrode sub-arrangements. Each electrode sub-arrangement may include a sub-set of electrodes 222 from among the plurality of electrodes 222. Further, the plurality of electrode sub-arrangements may, respectively, be associated or paired with the plurality of component-handling regions of the component-handling surface 210.

According to various aspects, the handling assembly 200 may include (e.g. further include) a dielectric layer or a non-conducting layer 231 over the electrode arrangement 220. Specifically, the dielectric layer 231 may be disposed over the metal layer 235 (e.g. corresponding to the electrodes 222 of the electrode arrangement 220), with the metal layer 235 between (e.g. sandwiched between) the body 230 (e.g. the plurality of protruding portions 230*b* of the body 230) and the dielectric layer 231. According to various aspects, the dielectric layer 231 may be a single, unified dielectric layer 231 which may be disposed over the metal layer 235 such that the single, unified dielectric layer 231 covers (e.g. substantially or entirely covers or coats) and/or conforms to a shape of the electrodes 222 formed of the metal layer 235. Further, the dielectric layer 231 may insulate or isolate the plurality of electrodes 222 from one another. It is envisaged that, in other implementations, the dielectric layer 231 may be composed of distinct or individual pieces (or sheets) of dielectric material (e.g. aluminum nitride or AlN, aluminum oxide or $Al_2O_3$, ceramics, organics such as polyimide, Polymethyl methacrylate (PMMA)/acrylics, etc.) respectively disposed over the metal layer 235, such that each piece of dielectric material covers (e.g. substantially or entirely covers or coats) and/or conforms to a shape of a respective electrode 222 formed of the metal layer 235 (e.g. in a manner so as to be capable of insulating or isolating the plurality of electrodes 222 from one another). According to various other aspects, the plurality of electrodes 222 may be insulated or isolated from one another not only by the dielectric layer 231 (or dielectric material), but also by a semiconductor material (e.g. silicon, which may be part of the body 230 of the handling assembly 200).

According to various aspects, the dielectric layer 231 may have a uniform (or substantially uniform) thickness throughout. For example, the dielectric layer 231 may be a uniformly thick nano or micro layer.

Figure 3A:
FIG. 3A is a schematic side view of a handling assembly which includes an electrode arrangement having a plurality of electrodes partially embedded within a body of the handling assembly, according to various aspects.
Figure 3A:
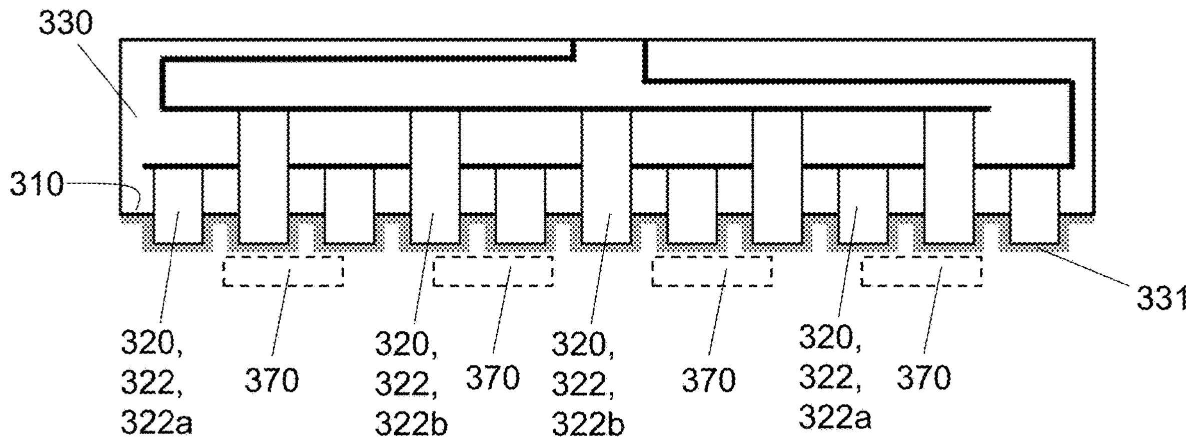
Figure 3A:
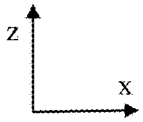

FIG. 3A is a schematic side view of a handling assembly which includes an electrode arrangement having a plurality of electrodes partially embedded within a body of the handling assembly, according to various aspects.

According to various aspects, there may be provided an apparatus which may include or may be the handling assembly 300. According to various aspects, the handling assembly 300 may contain any one or more or all the features and/or limitations of the handling assembly 100 of FIG. 1A and/or the handling assembly 200 of FIG. 2. In the following, the handling assembly 300 is described with like reference characters generally referring to the same or corresponding parts/features of the handling assembly 100 of FIG. 1A and/or the handling assembly 200 of FIG. 2. The description of the parts/features made with respect to the handling assembly 300 may also be applicable with respect to the handling assembly 100 and/or 200, and vice versa.

As in the handling assembly 100 of FIG. 1A, the handling assembly 300 may include a body 330 having a component-handling surface 310 for interacting and/or engaging with a plurality of semiconductor component arrangements 370.

As in the handling assembly 100 of FIG. 1A, the component-handling surface 310 of the handling assembly 300 may include a plurality of component-handling regions.

As depicted in FIG. 3A, according to various aspects, the handling assembly 300 may include (e.g. further include) an electrode arrangement 320 having a plurality of electrodes 322 partially embedded within the body 330 of the handling assembly 300. Specifically, as depicted in FIG. 3A, the plurality of electrodes 322 may be partially embedded within the body 330 such that at least a portion of each electrode 322 is within the body 330 while a remaining portion of the electrode 322 protrudes outward from the body 330 (e.g. from the component-handling surface 310 of the body 330). Further, as depicted, the plurality of electrodes 322 may be protruding outward from the component-handling surface 310 such that a distal end of each electrode 322 (e.g. an end that is furthest away from the component-handling surface 310) may be at a same or similar distance away from the component-handling surface 310 as the distal ends of the other electrodes 322 of the plurality of electrodes 322.

According to various aspects, the electrode arrangement 320 may include both positive electrodes 322*a* and negative electrodes 322*b*. The positive electrodes 322*a* may be connected to a positive voltage source (or supply), while the negative electrodes 322*b* may be connected to a negative voltage source (or supply). It is envisaged that any one or more of the positive electrodes 322*a* as well as any one or more of the negative electrodes 322*b* may be configured as a first electrode sub-arrangement of the electrode arrangement 320 configured to generate and/or provide a first electrostatic retention force over or at a first component-handling region of the component-handling surface 310 to hold or retain a first semiconductor component arrangement on or to the first component-handling region, while the remaining positive electrodes 322*a* and remaining negative electrodes 322*b* may be configured as a second and/or further electrode sub-arrangement(s) of the electrode arrangement 320 to respectively generate and/or provide a second and/or further electrostatic retention force over or at a second and/or further component-handling region(s) of the component-handling surface 310 to hold or retain a second and/or further semiconductor component arrangement on or to the second and/or further component-handling region.

With reference to FIG. 3A, according to various aspects, the handling assembly 300 may include (e.g. further include) a dielectric layer or a non-conducting layer 331 over the electrode arrangement 320. Specifically, the dielectric layer 331 may be disposed over (e.g. directly over or onto) the plurality of electrodes 322 (e.g. over the portions of the plurality of electrodes 322 which are protruding outward from the component-handling surface 310 of the body 330). According to various aspects, the dielectric layer 331 may be, but is not limited to being, an outermost layer of the handling assembly 300.

According to various aspects, the dielectric layer 331 may be a single, unified dielectric layer 331 which may be disposed over the plurality of electrodes 322 such that the single, unified dielectric layer 331 covers (e.g. substantially or entirely covers or coats) and/or conforms to a shape of the plurality of electrodes 322 (e.g. an outer shape of the portions of the plurality of electrodes 322 which are protruding outward from the component-handling surface 310 of the body 330). Further, the dielectric layer 331 may insulate or isolate the plurality of electrodes 322 (e.g. at least the portions of the plurality of electrodes 322 which are protruding outward from the component-handling surface 310) from one another. It is envisaged that, in other implementations, the dielectric layer 331 may be composed of distinct or individual pieces (or sheets) of dielectric material respectively disposed over the plurality of electrodes 322, in a manner such that the dielectric layer 331 (or dielectric material) insulates or isolates the plurality of electrodes 322 from one another. According to various other aspects, the plurality of electrodes 322 may be insulated or isolated from one another not only by the dielectric layer 331 (or dielectric material), but also by a semiconductor material (e.g. silicon, which may be part of the body 330 of the handling assembly 300).

As depicted in FIG. 3A, the dielectric layer 331 may have a patterned inner topography and outer topography (e.g. which may be formed via lithography). Further, the dielectric layer 331 may have a uniform (or substantially uniform) thickness throughout.

According to various aspects, the dielectric layer 331 may be composed of a material which allows the electrostatic retention force(s) generated by the electrode arrangement 320 to be able to reach across (e.g. penetrate, extend, propagate, etc.) the dielectric layer 331. Accordingly, when the dielectric layer 331 is an outermost layer of the handling assembly 300, an outer surface of the dielectric layer 331 may function as a "component-handling surface 310" for engaging (e.g. directly engaging or contacting) the semiconductor component arrangement(s) 370.

Figure 3B:
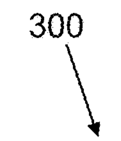
FIG. 3B is a schematic side view of the handling assembly of FIG. 3A with a traction layer over a component-handling surface of the body of the handling assembly, according to various aspects.
Figure 3B:
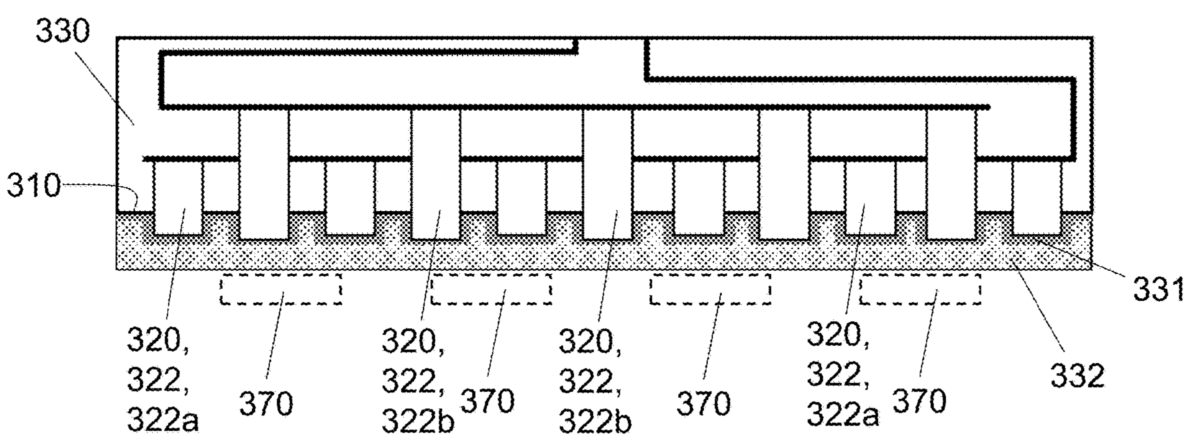
Figure 3B:
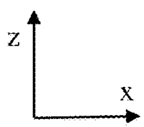

FIG. 3B is a schematic side view of the handling assembly of FIG. 3A with a traction layer over the component-handling surface of the body of the handling assembly, according to various aspects.

With reference to FIG. 3B, according to various aspects, the handling assembly 300 may include (e.g. optionally or further include) the traction layer 332 disposed over or on (e.g. indirectly over or on) the component-handling surface 310 of the body 330. For example, the traction layer 332 may be disposed over (e.g. directly over, so as to be in physical contact with) the dielectric layer 331 which, in turn, is directly on the component-handling surface 310 of the body 330. As such, the dielectric layer 331 may be between (e.g. sandwiched between) the traction layer 332 and the component-handling surface 310 of the body 330.

With reference to FIG. 3B, the traction layer 332 may be a separate or distinct layer from the dielectric layer 331. Further, the traction layer 332 may be an outermost layer of the handling assembly 300. According to various aspects, the traction layer 332 may be composed of a material which allows the electrostatic retention force(s) generated by the electrode arrangement 320 to be able to reach across (e.g. penetrate, extend, propagate, etc.) the traction layer 332 to its outer surface. Accordingly, the outer surface of the traction layer 332 may function as a "component-handling surface 310" for engaging (e.g. directly engaging or contacting) the semiconductor component arrangement(s) 370.

According to various aspects, the traction layer 332 (e.g. at least its outer surface) may be configured to provide enhanced grip and/or adhesion or tackiness for the semiconductor component arrangement(s) 370 disposed on the traction layer 332 (e.g. on its outer surface). For example, the outer surface of the traction layer 332 may include a textured pattern, ridges (e.g. micro-ridges), or the traction layer 332 (e.g. at least its outer surface) may be composed of a material or material composite that offers enhanced grip and/or adhesion or tackiness for the semiconductor component arrangement(s) 370. For example, the traction layer 332 may be composed of a material with anti-slip and/or anti-stick properties. According to various aspects, as an example, the traction layer 332 may be composed of a dry textured adhesive (or DTA) material (e.g. coated or laminated on the dielectric layer 331). Examples of dry textured adhesive material include Styrene-Ethylene/Butylene-Styrene (SEBS) thermoplastic elastomer, or acrylate polymers (e.g. polymethyl methacrylate or PMMA, etc.). The dry textured adhesive material may be configured such that the semiconductor component(s) of the semiconductor component arrangement(s) 370 may detach from the textured adhesive material under the influence of gravitational force when there is no electrostatic retention force generated or provided by the electrode arrangement 320.

According to various aspects, the traction layer 332 may be, but is not limited to being, a single, unified layer. Further, the outer surface of the traction layer 332 may be, but is not limited to being, a planar (e.g. flat or level) or substantially planar surface. It is envisaged that, in other implementations, the outer surface of the traction layer 332 may be non-planar. For example, in other implementations, the outer surface of the traction layer 332 may be curved (e.g. concave or convex shaped), may include a stepped cavity, a recess, or a receptacle (e.g. to accommodate a protrusion on a target workpiece), etc.

According to various aspects, the traction layer 332 may have a non-uniform thickness (e.g. since it may have a patterned internal topography, as depicted in FIG. 3B). According to various aspects, the traction layer 332 may be formed or created via lithography (e.g. imprint lithography or standard photolithography, or any other suitable processes).

Figure 4A:
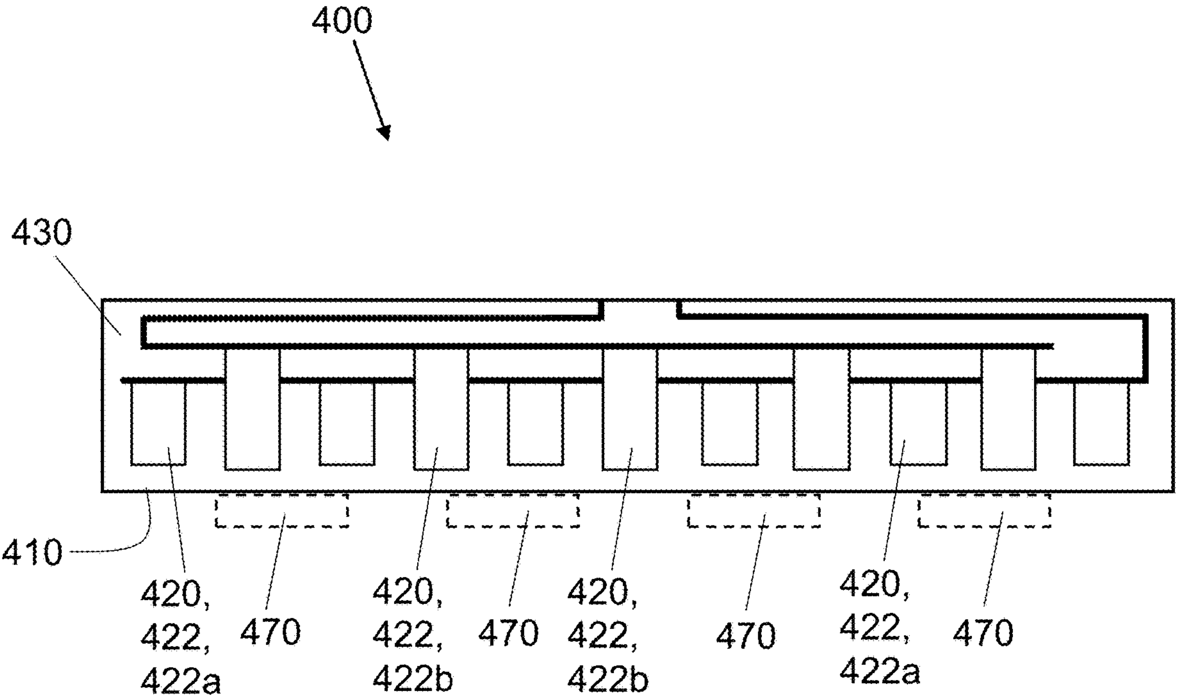
FIG. 4A is a schematic diagram of a handling assembly which includes an electrode arrangement having a plurality of electrodes which are fully embedded within a body of the handling assembly, according to various aspects.
Figure 4A:
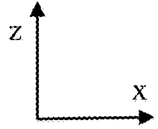

FIG. 4A is a schematic diagram of a handling assembly which includes an electrode arrangement having a plurality of electrodes which are fully embedded within a body of the handling assembly, according to various aspects.

According to various aspects, there may be provided an apparatus which may include or may be the handling assembly 400. According to various aspects, the handling assembly 400 may contain any one or more or all the features and/or limitations of the handling assembly 100 of FIG. 1A and/or the handling assembly 200 of FIG. 2 and/or the handling assembly 300 of FIG. 3A to FIG. 3B. In the following, the handling assembly 400 is described with like reference characters generally referring to the same or corresponding parts/features of the handling assembly 100 of FIG. 1A and/or the handling assembly 200 of FIG. 2 and/or the handling assembly 300 of FIG. 3A to FIG. 3B. The description of the parts/features made with respect to the handling assembly 400 may also be applicable with respect to the handling assembly 100 and/or 200 and/or 300, and vice versa.

As in the handling assembly 100 of FIG. 1A, the handling assembly 400 may include a body 430 having a component-handling surface 410 for interacting and/or engaging with a plurality of semiconductor component arrangements 470.

As in the handling assembly 100 of FIG. 1A, the component-handling surface 410 of the handling assembly 400 may include a plurality of component-handling regions.

According to various aspects, the handling assembly 400 may include (e.g. further include) an electrode arrangement 420 having a plurality of electrodes 422 fully or completely embedded within the body 430 of the handling assembly 400. That is, the electrodes 422 may be entirely within or covered by the body 430 of the handling assembly 400. Further, as depicted, each of the plurality of electrodes 422 within the body 430 of the handling assembly 400 may be at a predetermined distance apart or away from (e.g. behind) the component-handling surface 410 of the body 430. Accordingly, at least a portion of the body 430 (e.g. composed of a semiconductor material, such as silicon) that is interposed between the plurality of electrodes 422 and the component-handling surface 410 may isolate or insulate the plurality of electrodes 422 from the component-handling surface 410 (and, in turn, from semiconductor component arrangement(s) 470 which may directly contact the component-handling surface 410).

With reference to FIG. 4A, the electrode arrangement 420 may include both positive electrodes **422*a* and negative electrodes 422*b*. The positive electrodes 422*a* may be connected to a positive voltage source (or supply), while the negative electrodes 422*b* may be connected to a negative voltage source (or supply). It is envisaged that any one or more of the positive electrodes 422*a* as well as any one or more of the negative electrodes 422*b* may be configured as a first electrode sub-arrangement of the electrode arrangement 420 configured to generate and/or provide a first electrostatic retention force over or at a first component-handling region of the component-handling surface 410 to hold or retain a first semiconductor component arrangement 470 on or to the first component-handling region, while the remaining positive electrodes 422***a* and remaining negative electrodes 422*b* may be configured as a second and/or further electrode sub-arrangement(s) of the electrode arrangement 420 to respectively generate and/or provide a second and/or further electrostatic retention force over or at a second and/or further component-handling region(s) of the component-handling surface 410 to hold or retain a second and/or further semiconductor component arrangement 470 on or to the second and/or further component-handling region.

Figure 4B:
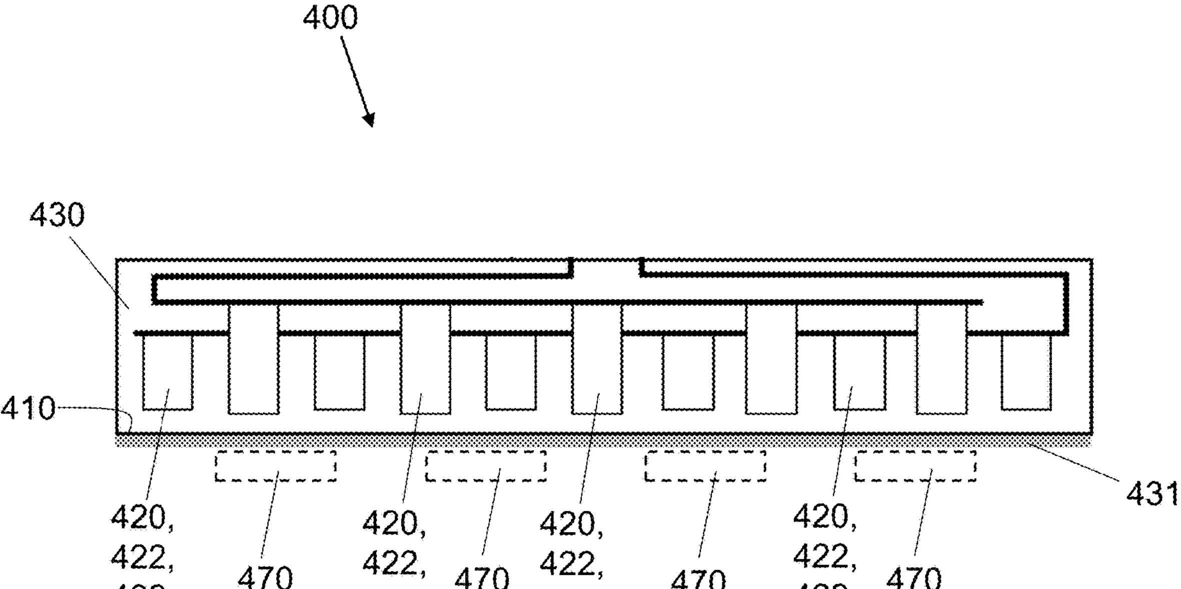
FIG. 4B is a schematic diagram of the handling assembly of FIG. 4A with a dielectric layer on a component-handling surface of the body of the handling assembly, according to various aspects.
Figure 4B:
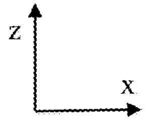

FIG. 4B is a schematic diagram of the handling assembly of FIG. 4A with a dielectric layer on a component-handling surface of the body of the handling assembly, according to various aspects.

Referring to FIG. 4B, according to various aspects, the handling assembly 400 may include (e.g. further include) a dielectric layer or a non-conducting layer 431 over the electrode arrangement 420. Specifically, the dielectric layer 431 may be disposed over (e.g. directly over or onto) the component-handling surface 410. According to various aspects, the dielectric layer 431 may be a single, unified dielectric layer 431. Further, as depicted in FIG. 4B, according to various aspects, the dielectric layer 431 may be a planar or flat layer (e.g. having a uniform thickness). It is envisaged that, in other implementations, the dielectric layer 431 may be composed of distinct or individual pieces (or sheets, pads, etc.) of dielectric material on the component-handling surface 410. Further, the distinct or individual pieces of dielectric material may be within the component-handling regions of the component-handling surface 410 of the body 430. The distinct or individual pieces of dielectric material may serve to space the semiconductor component arrangement(s) 470 apart from the component-handling surface 410 (in other words, prevent the semiconductor component arrangement(s) 470 from coming into direct contact with the component-handling surface 410) when the semiconductor component arrangement(s) 470 are held on the component-handling surface 410 by the electrostatic retention force(s) of the electrode arrangement 420.

Figure 4C:
FIG. 4C is a schematic diagram of the handling assembly of FIG. 4A with a traction layer on the component-handling surface of the body of the handling assembly, according to various aspects.
Figure 4C:
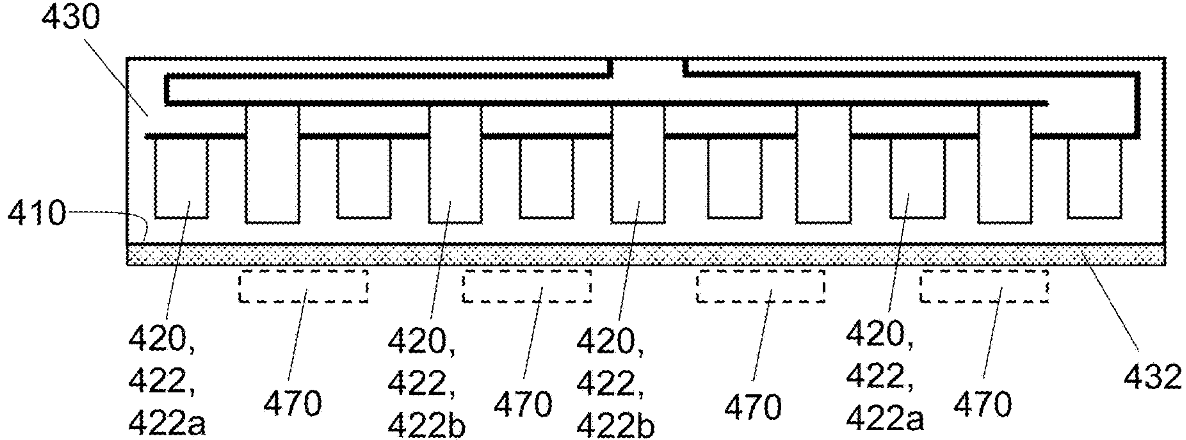
Figure 4C:
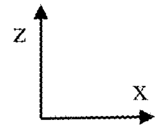

FIG. 4C is a schematic diagram of the handling assembly of FIG. 4A with a traction layer on the component-handling surface of the body of the handling assembly, according to various aspects.

With reference to FIG. 4C, according to various aspects, the handling assembly 400 may include (e.g. optionally or further include) the traction layer 432 disposed over or on (e.g. directly over or on) the component-handling surface 410 of the body 430. Specifically, with reference to FIG. 4C, the traction layer 432 may be an outermost layer of the handling assembly 400. For example, the traction layer 432 may be disposed over (e.g. directly over, so as to be in physical contact with) the component-handling surface 410 of the body 430 (e.g. without the dielectric layer 431). According to various aspects, the traction layer 432 may be composed of a material which allows the electrostatic retention force(s) generated by the electrode arrangement 420 to be able to reach across (e.g. penetrate, extend, propagate, etc.) the traction layer 432 to its outer surface. Accordingly, the outer surface of the traction layer 432 may function as a "component-handling surface 410" for engaging (e.g. directly engaging or contacting) the semiconductor component arrangement(s) 470.

According to various aspects, the traction layer 432 (e.g. at least its outer surface) may be configured to provide enhanced grip and/or adhesion or tackiness for the semiconductor component arrangement(s) 470 on the traction layer 432 (e.g. on its outer surface). For example, the outer surface of the traction layer 432 may include a textured pattern, ridges (e.g. micro-ridges), or the traction layer 432 (e.g. at least its outer surface) may be composed of a material or material composite that offers enhanced grip and/or adhesion or tackiness for the semiconductor component arrangement(s) 470. For example, the traction layer 432 may be composed of a material with anti-slip and/or anti-stick properties. According to various aspects, as an example, the traction layer 432 may be composed of a dry textured adhesive material (e.g. coated or laminated on the component-handling surface 410 of the body 430).

According to various aspects, the traction layer 432 may be a single, unified layer. Further, as depicted in FIG. 4C, according to various aspects, the traction layer 432 may be a planar or flat layer (e.g. having a uniform thickness). As depicted, the outer surface of the traction layer 432 may be a planar (e.g. flat or level) or substantially planar surface (e.g. parallel with a planar component-handling surface 410). It is envisaged that, in other implementations, the outer surface of the traction layer 432 may be non-planar. For example, in other implementations, the outer surface of the traction layer 432 may be curved (e.g. concave or convex shaped), may include a stepped cavity, a recess, or a receptacle (e.g. to accommodate a protrusion on a target workpiece), etc.

According to various other aspects, the traction layer 432 may further include a dielectric material (e.g. within the traction layer 432 itself) such that the traction layer 432 may have a dual capability of providing enhanced grip (or tackiness) as well as having dielectric material properties.

Figure 5A:
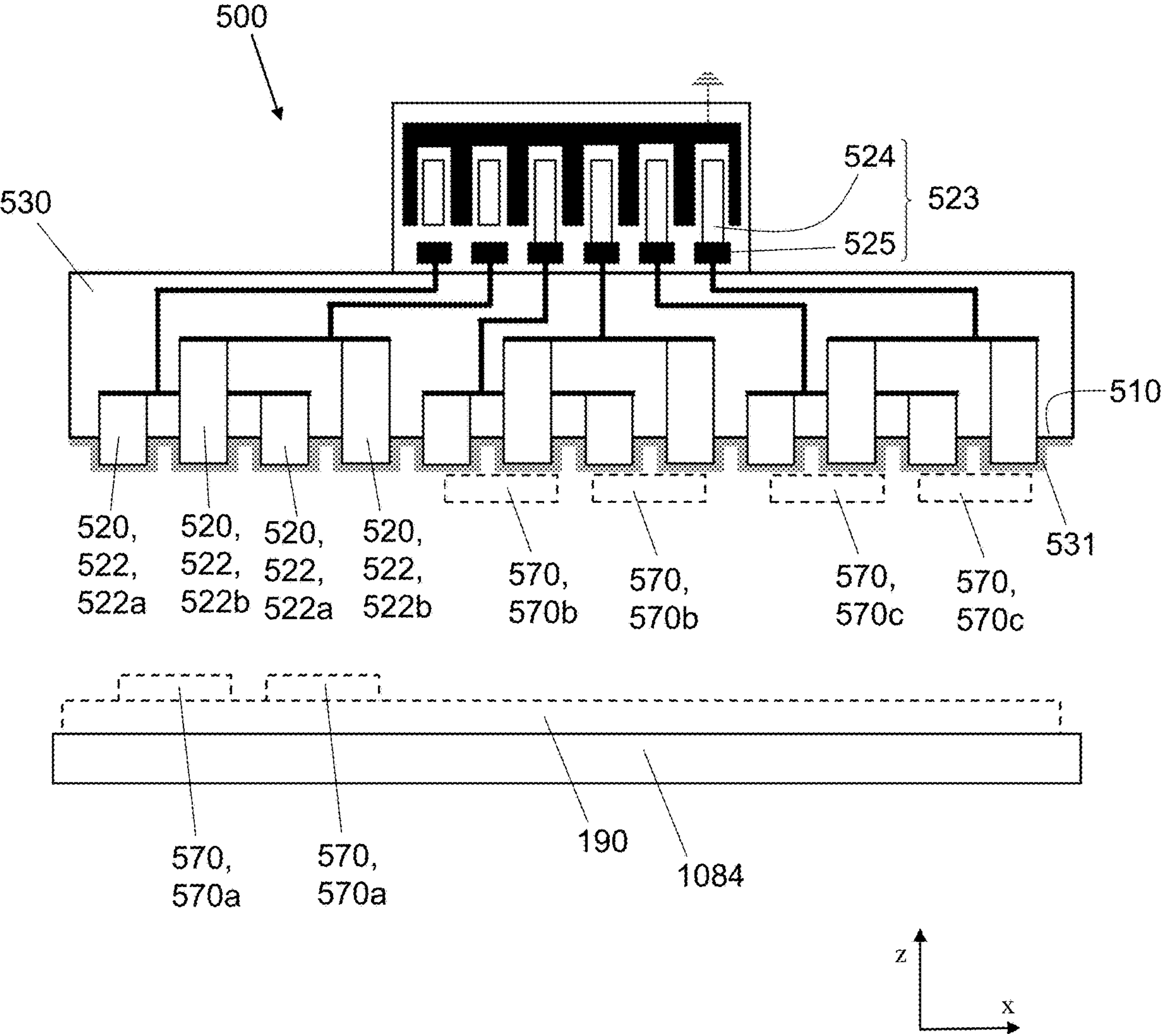
FIG. 5A is a schematic diagram depicting an exemplary circuitry for an electrode arrangement having a plurality of electrode sub-arrangements, according to various aspects.

FIG. 5A is a schematic diagram depicting an exemplary circuitry for an electrode arrangement having a plurality of electrode sub-arrangements, according to various aspects.

According to various aspects, there may be provided an apparatus which may include or may be the handling assembly 500. According to various aspects, the handling assembly 500 may contain any one or more or all the features and/or limitations of the handling assembly 100 of FIG. 1A and/or the handling assembly 200 of FIG. 2 and/or the handling assembly 300 of FIG. 3A to FIG. 3B and/or the handling assembly 400 of FIG. 4A to FIG. 4C. In the following, the handling assembly 500 is described with like reference characters generally referring to the same or corresponding parts/features of the handling assembly 100 of FIG. 1A and/or the handling assembly 200 of FIG. 2 and/or the handling assembly 300 of FIG. 3A to FIG. 3B and/or the handling assembly 400 of FIG. 4A to FIG. 4C. The description of the parts/features made with respect to the handling assembly 500 may also be applicable with respect to the handling assembly 100 and/or 200 and/or 300 and/or 400, and vice versa.

As in the handling assembly 100 of FIG. 1A, the handling assembly 500 may include a body 430 having a component-handling surface 510. As an example, as depicted in FIG. 5A, the handling assembly 500 may include a dielectric layer or a non-conducting layer 531 over and/or on the component-handling surface 510.

Further, as in the handling assembly 100 of FIG. 1A, the handling assembly 500 may include an electrode arrangement 520. The electrode arrangement 520 may include both positive electrodes 522*a* and negative electrodes 522*b*. The positive electrodes 522*a* may be connected to a respective positive voltage source (or supply), while the negative electrodes 522*b* may be connected to a respective negative voltage source (or supply). As depicted in FIG. 5A, dielectric layer 531 may be over and/or covering at least a portion (e.g. a protruding portion) of each electrode 522 of the electrode arrangement 520.

According to various aspects, at least one positive electrode 522*a* and at least one negative electrode 522*b* may be configured as a first electrode sub-arrangement of the electrode arrangement 520 configured to generate and/or provide a first electrostatic retention force over or at a first component-handling region of the component-handling surface 510 to hold or retain a first semiconductor component arrangement 570*a* on or to the first component-handling region, and at least one other positive electrode 522*a* and at least one other negative electrode 522*b* may be configured as a second electrode sub-arrangement of the electrode arrangement 520 configured to generate and/or provide a second electrostatic retention force over or at a second component-handling region of the component-handling surface 510 to hold or retain a second semiconductor component arrangement 570*b* on or to the second component-handling region. Further, at least one other positive electrode 522*a* and at least one other negative electrode 522*b* may be configured as a third electrode sub-arrangement of the electrode arrangement 520 configured to generate and/or provide a third electrostatic retention force over or at a third component-handling region of the component-handling surface 510 to hold or retain a third semiconductor component arrangement 570*c* on or to the third component-handling region.

According to various aspects, each electrode sub-arrangement within the plurality of electrode sub-arrangements may be operable or controllable independently from other electrode sub-arrangements. For example, each electrode sub-arrangement may be connected to a respective (or its own) voltage source (or supply), enabling independent control over the charging and discharging (of the electrostatic retention force) of the electrode sub-arrangement. More specifically, a conductor arrangement 523, which may include a plurality of conductive and/or mechanical pins 524 (which may be movable through mechanical movement), may be configured to selectively "bridge" one or more electrode sub-arrangement(s) to respective voltage source(s) (e.g. to charge the electrode sub-arrangement(s) or its electrodes 522) or to cease the voltage supply to (e.g. to discharge) one or more electrode sub-arrangement(s) by disconnecting the one or more electrode sub-arrangement(s) from a voltage source. According to various aspects, the conductor arrangement 523 may also be arranged (or configured) to enable any one or more electrodes (e.g. of any one or more electrode sub-arrangement(s)) to change its polarity (e.g. from a negative charge to a positive charge, or vice versa), by connecting (or bridging) those electrode(s) 522 to a voltage source of opposite polarity. According to various aspects, said "bridging" may include moving a respective pin 524 of the conductor arrangement 523 so that the pin 524 contacts (e.g. electrically contact or connects to) a respective pad 525 (e.g. conductive pad within the body 430 of the handling assembly 500) that may, in turn, be electrically connected to a respective electrode sub-arrangement of the handling assembly 500. As depicted in FIG. 5A, the plurality of pins 524 of the conductor arrangement 523 may be independent of each other (e.g. independently movable and/or isolated and/or insulated from one another), thereby allowing independent charging and discharging of any one or more electrode sub-arrangement(s).

Figure 5B:
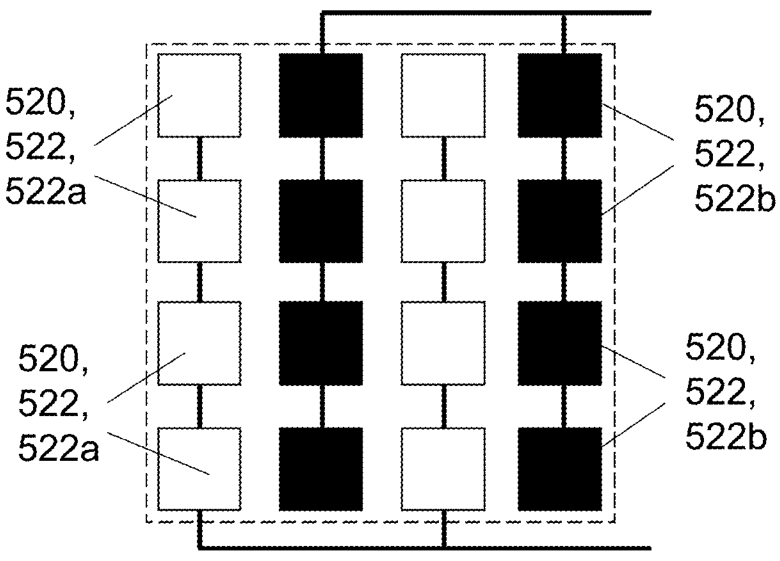
FIG. 5B is a schematic plan view of a first electrode sub-arrangement of the handling assembly of FIG. 5A, according to a first implementation.

FIG. 5B is a schematic plan view of a first electrode sub-arrangement of the handling assembly of FIG. 5A, according to a first implementation.

Figure 5C:
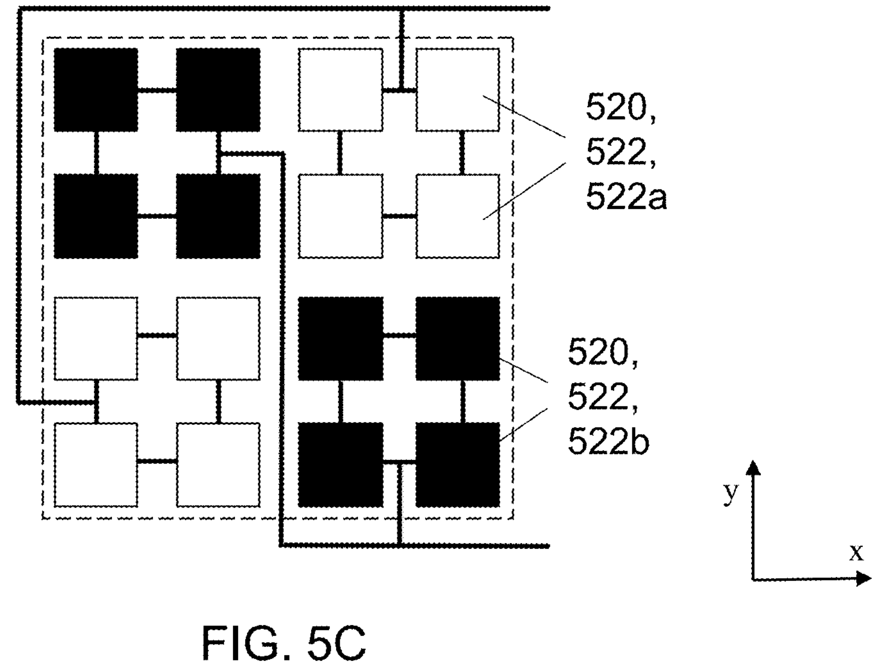
FIG. 5C is a schematic plan view of a first electrode sub-arrangement of the handling assembly of FIG. 5A, according to a second implementation.

FIG. 5C is a schematic plan view of a first electrode sub-arrangement of the handling assembly of FIG. 5A, according to a second implementation.

With reference to FIG. 5A to FIG. 5C, all of the positive electrodes 522*a* within the first electrode sub-arrangement (or any electrode sub-arrangement) of the electrode arrangement 520 may be grouped together and/or connected by a respective line (e.g. conductive line, metal line, etc.) (herein referred to as "first line"). According to various aspects, the first line may be connected or connectable to a positive voltage source (or supply) for positively biasing the positive electrodes 522*a*.

Conversely, all of the negative electrodes 522*b* within the first electrode sub-arrangement (or any electrode sub-arrangement) of the electrode arrangement 520 may be grouped together and/or connected by a respective line (e.g. conductive line, metal line, etc.) (herein referred to as "second line"). According to various aspects, the second line may be connected or connectable to a negative voltage source (or supply) for negatively biasing the negative electrodes 522*b*.

FIG. 5B depicts a plurality of positive electrodes 522*a* and a plurality of negative electrodes 522*b* within the first electrode sub-arrangement (or any electrode sub-arrangement) of the electrode arrangement 520 organized in an alternating fashion, corresponding to (or imitating) groups of lines or a striped pattern, which may be achieved by connecting each line of electrodes 522 to a respective positive or negative voltage source.

FIG. 5C depicts the plurality of positive electrodes 522*a* and the plurality of negative electrodes 522*b* within the first electrode sub-arrangement (or any electrode sub-arrangement) of the electrode arrangement 520 organized in an alternating fashion, corresponding to (or imitating) a checkered-like pattern, which may be achieved by connecting each group of electrodes 522 (being a sub-set of the checkered-like pattern) to a respective positive or negative voltage source.

According to various aspects, the plurality of electrodes 522 within each electrode sub-arrangement may be spaced uniformly (e.g. substantially uniformly) apart from each other along the x-axis and the y-axis. For example, neighboring electrodes 522 along the x-axis and the y-axis may be between approximately 100 μm to 200 μm apart. It is envisaged that, in other implementations, the plurality of electrodes 522 within each electrode sub-arrangement may be spaced non-uniformly apart from one another.

According to various aspects, the plurality of positive and negative electrodes 522*a* and 522*b* within each electrode sub-arrangement may be configured (e.g. sized and/or arranged) in a manner such that when semiconductor component(s) (e.g. chiplets) of a corresponding semiconductor component arrangement 570*a*, 570*b*, or 570*c* is placed over the electrode sub-arrangement within a designated or corresponding component-handling region of the component-handling surface 510, each of these semiconductor component(s) may be aligned with (e.g. sit directly over) both positive and negative electrodes 522*a* and 522*b*. Consequently, the electrostatic retention force generated by a combination of positive and negative electrodes 522*a* and 522*b* may apply both positive and negative biases or charges to these semiconductor component(s). As a result, these semiconductor component(s), on average, may not attain a significant single polarity and may maintain an overall neutral charge. In other words, these semiconductor component(s) may not become polarized to a significantly high polarity during retention to the component-handling surface 510 (e.g. during chucking) or after chucking.

FIG. 6 is a flow chart depicting a method of assembling a handling assembly, according to various aspects.

According to various aspects, the method may include providing the handling assembly 100, 200, 300, 400, or 500.

Specifically, the method may include providing the body 130, 230, 330, 430, or 530 of the handling assembly 100, 200, 300, 400, or 500. According to various aspects, the body 130, 230, 330, 430, or 530 may be composed of, or constructed from, a semiconductor material (e.g. silicon). As an example, according to various aspects, the body 130, 230, 330, 430, or 530 may be fabricated on a silicon wafer using one or more manufacturing step(s), such as coating, curing, patterning, etching, lithography (e.g. additive and/or subtractive lithography, depending on a material in use), deposition, electroplating, chemical mechanical planarization, etc. Further, according to various aspects, the one or more manufacturing step(s) may (e.g. optionally) be employed to create or form the plurality of protruding portions (e.g. silicon pillars or glass pillars).

The method may include configuring the body 130, 230, 330, 430, or 530 to have the component-handling surface 110, 210, 310, 410, or 510. In other words, the method may include forming the component-handling surface 110, 210, 310, 410, or 510 on the body 130, 230, 330, 430, or 530. According to various aspects, the component-handling surface 110, 210, 310, 410, or 510 may include the plurality of component-handling regions 111. For example, the component handling-surface may include at least (i) the first component-handling region 111*a* configured to accommodate the first semiconductor component arrangement 170*a* or 570*a* and (ii) the second component-handling region 111*b* configured to accommodate the second semiconductor component arrangement 170*b* or 570*b*. It is envisaged that, in other implementations, the component-handling surface 110, 210, 310, 410, or 510 may include one or more further (e.g. additional or other) component-handling region(s) 111, which may be distinct from and/or non-overlapping with the first component-handling region 111*a* and the second component-handling region 111*b*. The one or more further (e.g. additional or other) component-handling region(s) 111 may be configured or designated to respectively accommodate one or more further semiconductor component arrangement(s) 170, 270, 370, 470, or 570.

According to various aspects, the method may include (e.g. further include) disposing the electrode arrangement 120, 220, 320, 420, or 520 at the body 130, 230, 330, 430, or 530 and/or configuring the electrode arrangement 120, 220, 320, 420, or 520 in a manner such that the electrode arrangement 120, 220, 320, 420, or 520 may be capable of independently toggling each component-handling region 111 (e.g. each of the first component-handling region 111*a* and the second component-handling region 111*b*) between the active state and the inactive state. For example, the electrode arrangement 120, 220, 320, 420, or 520 may be on the body 130, 230, 330, 430, or 530 (e.g. disposed on or over the component-handling surface 110, 210, 310, 410, or 510 of the body 130, 230, 330, 430, or 530 via patterning, etching, electroplating, etc.). As another example, a plurality of electrodes 122, 222, 322, or 522 of the electrode arrangement 120, 220, 320, 420, or 520 may be partially embedded within the body 130, 230, 330, 430, or 530, in a manner such that a portion of each electrode 122, 222, 322, or 522 protrudes from the component-handling surface 110, 210, 310, 410, or 510 of the body 130, 230, 330, 430, or 530. As yet another example, the plurality of electrodes 122, 222, or 422 of the electrode arrangement 120, 220, 320, 420, or 520 may be fully or entirely embedded within the body 130, 230, 330, 430, or 530, in a manner such that a portion of the body 130, 230, 330, 430, or 530 may be interposed between the plurality of electrodes 122, 222, or 422 and the component-handling surface 110, 210, 310, 410, or 510 of the body 130, 230, 330, 430, or 530.

According to various aspects, the method may include (e.g. further include) configuring the electrode arrangement 120, 220, 320, 420, or 520 such that, in the active state, the electrode arrangement 120, 220, 320, 420, or 520 generates and/or provides one or more (independent) electrostatic retention force(s), respectively, over or at one or more (distinct) component-handling region(s) 111.

According to various aspects, the method may include (e.g. further include) configuring the electrode arrangement 120, 220, 320, 420, or 520 to include a plurality of electrode sub-arrangements 121 which may be, respectively, associated or paired with the plurality of component-handling regions 111. More specifically, the method may include aligning each electrode sub-arrangement 121 of the plurality of electrode sub-arrangements 121 with a respective component-handling region 111 of the plurality of component-handling regions 111. According to various aspects, the method may include (e.g. further include) configuring the electrode arrangement 120, 220, 320, 420, or 520 such that any one or each (i.e. all) electrode sub-arrangement 121 of the electrode arrangement 120, 220, 320, 420, or 520 may include (i) one or more positive electrode(s) 122*a*, 322*a*, 422*a*, or 522*a*, or may include (ii) one or more negative electrode(s) 122*b*, 322*b*, 422*b*, or 522*b*, or may include (ii) a combination or mixture of one or more positive electrode(s) 122*a*, 322*a*, 422*a*, or 522*a* as well as one or more negative electrode(s) 122*b*, 322*b*, 422*b*, or 522*b*. Where the electrode sub-arrangement 121 includes more than one (in other words, a plurality of) electrodes 122, 222, 322, 422, or 522, the electrodes 122, 222, 322, 422, or 522 may be distributed or arranged, within a corresponding (e.g. associated or paired) component-handling region 111, in any configuration or format or pattern (e.g. grid pattern, groups of grids, checkered pattern, line pattern, groups/rows/columns of lines, striped pattern, etc.).

According to various aspects, each electrode sub-arrangement 121 may be configured to generate and/or provide a respective or independent electrostatic retention force (or field) over a corresponding (e.g. associated or paired) component-handling region 111. As an example, this may be achieved by applying a voltage in the range of hundreds (e.g. one hundred) to thousands (e.g. five thousand) of volts to the electrode sub-arrangement 121. According to various aspects, when the handling assembly 100, 200, 300, 400, or 500 includes the dielectric layer 231, 331, 431, or 531, the electrode(s) 122, 222, 322, 422, or 522 within each electrode sub-arrangement 121 may be separated or spaced apart from the semiconductor-component arrangement(s) by the dielectric layer 231, 331, 431, or 531. In this configuration, both the Coulomb force and the Johnsen-Rahbek force may be applicable.

According to various other aspects, each electrode sub-arrangement 121 may be additionally configured to provide a "thermal heating" function, and this function may be adjustable based on the supplied or applied current level to the electrode sub-arrangement 121. Thus, according to various other aspects, each electrode sub-arrangement 121 of the electrode arrangement 120, 220, 320, 420, or 520 may be configured to have a dual capability of generating electrostatic retention force (or field) as well as providing "thermal heating". According to various aspects, this dual capability may be performed simultaneously or sequentially.

According to various aspects, the method may include forming each electrode 122, 222, 322, 422, or 522 of the electrode arrangement 120, 220, 320, 420, or 520 from a metal material (e.g. copper, aluminum, titanium, etc., or metal alloy). That is, each electrode may be composed of a metal material. According to various aspects, all electrodes 122, 222, 322, 422, or 522 (e.g. including any positive electrodes 122*a*, 322*a*, 422*a*, or 522*a* and negative electrodes 122*b*, 322*b*, 422*b*, or 522*b*) of the electrode arrangement 120, 220, 320, 420, or 520 may be composed of a same metal material as one another.

According to various aspects, the method may include (e.g. further include) providing (e.g. disposing) the dielectric layer 231, 331, 431, or 531 over the electrode arrangement 120, 220, 320, 420, or 520. For example, the dielectric layer 231, 331, 431, or 531 may be directly on the electrode arrangement 120, 220, 320, 420, or 520 (as depicted in FIG. 3A), or may be indirectly on or over the electrode arrangement 120, 220, 320, 420, or 520 (as depicted in FIG. 4B). Furthermore, according to various aspects, the dielectric layer 231, 331, 431, or 531 may be removably coupled to the component-handling surface 110, 210, 310, 410, or 510 of the body 130, 230, 330, 430, or 530. Accordingly, the dielectric layer 231, 331, 431, or 531 may be removable or replaceable (e.g. when worn or damaged). The dielectric layer 231, 331, 431, or 531 may include or may be composed of dielectric material such as inorganics (e.g. silicon dioxide or $SiO_2$, silicon nitride or $Si_3N_4$, etc.). According to various aspects, the dielectric layer 231, 331, 431, or 531 may, additionally, be configured and/or arranged in a manner so as to separate (e.g. physically separate) electrodes 122, 222, 322, 422, or 522 of the electrode arrangement 120, 220, 320, 420, or 520 from the semiconductor material (e.g. silicon) of the body 130, 230, 330, 430, or 530.

According to various aspects, when the dielectric layer 231, 331, 431, or 531 is configured as an outermost layer of the handling assembly 100, 200, 300, 400, or 500, the dielectric layer 231, 331, 431, or 531 may be arranged in a manner such that an outer surface of the dielectric layer 231, 331, 431, or 531 may be directed away from the body 130, 230, 330, 430, or 530 of the handling assembly 100, 200, 300, 400, or 500 (e.g. away from the component-handling surface 110, 210, 310, 410, or 510 of the body 130, 230, 330, 430, or 530) so that the outer surface of the dielectric layer 231, 331, 431, or 531 may be capable of directly engaging the first semiconductor component arrangement 170*a* or 570*a* and the second semiconductor component arrangement 170*b* or 570*b*. Further, the method may include (e.g. optionally or further include) forming positioning mark(s) (not shown) on the outer surface of the dielectric layer 231, 331, 431, or 531 corresponding to where the semiconductor component(s) (or each semiconductor component) of the semiconductor component arrangement(s) 170, 270, 370, 470, or 570 are intended to be placed on the dielectric layer 231, 331, 431, or 531.

According to various aspects, the method may include (e.g. further include) providing (e.g. disposing) the traction layer 332 or 432 over the component-handling surface 110, 210, 310, 410, or 510 of the body 130, 230, 330, 430, or 530. Specifically, the traction layer 332 or 432 may be removably coupled to the component-handling surface 110, 210, 310, 410, or 510 of the body 130, 230, 330, 430, or 530. Accordingly, the traction layer 332 or 432 may be removable or replaceable (e.g. when worn or damaged). Accordingly, according to various aspects, the traction layer 332 or 432 may be configured as an outermost layer of the handling assembly 100, 200, 300, 400, or 500. Accordingly, the outer surface of the traction layer 332 or 432 may be arranged (e.g. oriented away from the body 130, 230, 330, 430, or 530 of the handling assembly 100, 200, 300, 400, or 500) so that it may be capable of directly engaging the first semiconductor component arrangement 170*a* or 570*a* and the second semiconductor component arrangement 170*b* or 570*b*. According to various aspects, the method may include (e.g. optionally or further include) forming positioning mark(s) (not shown) on the outer surface of the traction layer 332 or 432 corresponding to where the semiconductor component(s) (or each semiconductor component) of the semiconductor component arrangement(s) 170, 270, 370, 470, or 570 are intended to be placed on the traction layer 332 or 432.

According to various aspects, the method may include (e.g. further include) providing or configuring the handling assembly 100, 200, 300, 400, or 500 with the sensor unit 150. For example, the sensor unit 150 may be embedded or integrated into the body 130, 230, 330, 430, or 530 of the handling assembly 100, 200, 300, 400, or 500.

According to various aspects, the method may include (e.g. further include) providing or configuring the handling assembly 100, 200, 300, 400, or 500 with the ionizer or static dissipative material (not shown).

According to various aspects, the method may include disposing the first semiconductor component arrangement 170*a* or 570*a* on the first component-handling region 111*a* of the component-handling surface 110, 210, 310, 410, or 510 of the handling assembly 100, 200, 300, 400, or 500 and disposing the second semiconductor component arrangement 170*b* or 570*b* on the second component-handling region 111*b* of the component-handling surface 110, 210, 310, 410, or 510. For example, the handling assembly 100, 200, 300, 400, or 500 may be oriented such that the component-handling surface 110, 210, 310, 410, or 510 faces upwards, for the first semiconductor component arrangement 170*a* or 570*a* and the second semiconductor component arrangement 170*b* or 570*b* to be disposed or placed onto the component-handling surface 110, 210, 310, 410, or 510.

According to various aspects, the method may include (e.g. further include) generating, using the electrode arrangement 120, 220, 320, 420, or 520 of the handling assembly 100, 200, 300, 400, or 500, the first electrostatic retention force over or at the first component-handling region 111*a* to retain the first semiconductor component arrangement 170*a* or 570*a* on the first component-handling region 111*a* and/or generating the second electrostatic retention force over or at the second component-handling region 111*b* to retain the second semiconductor component arrangement 170*b* or 570*b* on the second component-handling region 111*b*.

According to various aspects, the method may include (e.g. further include) positioning, disposing and/or orientating the handling assembly 100, 200, 300, 400, or 500 over the target workpiece 190, with the component-handling surface 110, 210, 310, 410, or 510 directed towards or facing the target workpiece 190 (e.g. facing the upper surface of the target workpiece 190). Additionally, the component-handling surface 110, 210, 310, 410, or 510 (and the semiconductor component arrangement(s) 170, 270, 370, 470, or 570 thereon) may be spaced apart from the upper surface of the target workpiece 190 (e.g. by a predetermined gap or distance).

According to various aspects, the method may include (e.g. further include) ceasing (e.g. discharging, discontinuing or reducing a magnitude of) the first electrostatic retention force so that the first semiconductor component arrangement 170*a* or 570*a* (e.g. one or more semiconductor components) is released (e.g. simultaneously released) from the first component-handling region 111*a* of the component-handling surface 110, 210, 310, 410, or 510 of the handling assembly 100, 200, 300, 400, or 500 onto the target workpiece 190 (e.g. onto a first region of the target workpiece 190). According to various aspects, the first electrostatic retention force may be ceased, while the second electrostatic retention force is still being generated by the electrode arrangement 120, 220, 320, 420, or 520 and/or provided over or at the second component-handling region 111*b*.

According to various aspects, the method may include (e.g. further include) ceasing the second electrostatic retention force so that the second semiconductor component arrangement 170*b* or 570*b* (e.g. one or more other semiconductor components) is released (e.g. simultaneously released) from the second component-handling region 111*b* of the component-handling surface 110, 210, 310, 410, or 510 of the handling assembly 100, 200, 300, 400, or 500 onto the target workpiece 190 (e.g. onto a second region of the target workpiece 190).

According to various aspects, the abovementioned mode of releasing the semiconductor component arrangement(s) 170, 270, 370, 470, or 570 onto the target workpiece 190, via regulating the electrostatic retention force(s), by the handling assembly 100, 200, 300, 400, or 500 achieves placement of the semiconductor component arrangement(s) 170, 270, 370, 470, or 570 onto the target workpiece 190 without requiring any application of mechanical forces to the semiconductor component(s) of the semiconductor component arrangement(s) 170, 270, 370, 470, or 570 during their placement onto the target workpiece 190. Accordingly, the aforementioned releasing or placement process may be referred to as "zero force semiconductor component release or placement".

According to various aspects, the method may include (e.g. further include) disposing further or additional semiconductor component arrangement(s) 170, 270, 370, 470, or 570 on further or additional component-handling region(s) 111 of the component-handling surface 110, 210, 310, 410, or 510 of the handling assembly 100, 200, 300, 400, or 500.

According to various aspects, the method may include (e.g. further include) generating, using the electrode arrangement 120, 220, 320, 420, or 520 of the handling assembly 100, 200, 300, 400, or 500, further or other respective electrostatic retention force(s) over or at the further or additional component-handling region(s) 111 to respectively retain the further or additional semiconductor component arrangement(s) 170, 270, 370, 470, or 570 on the further or additional component-handling region(s) 111.

According to various aspects, the method may include (e.g. further include) positioning or disposing and/or orientating the handling assembly 100, 200, 300, 400, or 500 over a target workpiece 190, with the component-handling surface 110, 210, 310, 410, or 510 directed towards or facing the target workpiece 190 (e.g. facing the upper surface of the target workpiece 190).

According to various aspects, the method may include (e.g. further include) ceasing the one or more of the further or other electrostatic retention force(s) so that one or more of the further or additional semiconductor component arrangement(s) 170, 270, 370, 470, or 570 is released (e.g. simultaneously released) from the further component-handling region(s) 111 of the component-handling surface 110, 210, 310, 410, or 510 of the handling assembly 100, 200, 300, 400, or 500 onto the target workpiece 190 (e.g. onto further or other region(s) of the target workpiece 190).

According to various aspects, the method may include providing the handling system 1000.

Specifically, the method may include providing the movement assembly 1080 and coupling the movement assembly to the handling assembly 100, 200, 300, 400, or 500 to form the handling system 1000.

While the disclosure has been particularly shown and described with reference to specific aspects, it should be understood by those skilled in the art that various changes, modification, and variation in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

To more readily understand and put into practical effect the present apparatus (e.g. handling assembly), system (e.g. handling system), and method, they will now be described by way of examples. For the sake of brevity, duplicate descriptions of features and properties may be omitted.

EXAMPLES

Example 1 provides an apparatus (e.g. a handling assembly). The apparatus may include a body that includes a component-handling surface. The component-handling surface may include a (or at least a) first component-handling region configured to accommodate a first semiconductor component arrangement and a (or at least a) second component-handling region configured to accommodate a second semiconductor component arrangement. The apparatus may further include an electrode arrangement disposed at the body in a manner so as to be capable of independently toggling each of the first component-handling region and the second component-handling region between an active state and an inactive state, for which, in the active state the electrode arrangement may provide an electrostatic retention force at the component-handling region (e.g. at the corresponding or selected component-handling region), for which, the electrostatic retention force may be configured to retain a corresponding semiconductor component arrangement on the component-handling region.

Example 2 may include the apparatus of example 1 and/or any other example disclosed herein, for which, the electrode arrangement may include at least one positive electrode and at least one negative electrode configured to generate the electrostatic retention force.

Example 3 may include the apparatus of example 1 and/or any other example disclosed herein, for which, the electrode arrangement may include (i) a first electrode sub-arrangement including at least one positive electrode and at least one negative electrode which are aligned with the first component-handling region and (ii) a second electrode sub-arrangement including at least one other positive electrode and at least one other negative electrode which are aligned with the second component-handling region, for which, with the first component-handling region in the active state, the first electrode sub-arrangement may be configured to generate a first electrostatic retention force at the first component-handling region to retain the first semiconductor component arrangement on the first component-handling region and, for which, with the second component-handling region in the active state, the second electrode sub-arrangement may be configured to generate a second electrostatic retention force at the second component-handling region to retain the second semiconductor component arrangement on the second component-handling region.

Example 4 may include the apparatus of example 3, for which, the first electrostatic retention force may be of a same or equal (e.g. substantially equal) magnitude as the second electrostatic retention force.

Example 5 may include the apparatus of example 3, for which, the first electrostatic retention force may be of a different magnitude from the second electrostatic retention force.

Example 6 may include the apparatus of example 1 and/or any other example disclosed herein, for which, the first component-handling region is of a same shape or size as the second component-handling region.

Example 7 may include the apparatus of example 1 and/or any other example disclosed herein, for which, the first component-handling region is of a different shape or size from the second component-handling region.

Example 8 may include the apparatus of example 1 and/or any other example disclosed herein, for which, the electrode arrangement may include a plurality of electrodes which are fully embedded within the body, with a portion of the body interposed between the plurality of electrodes and the component-handling surface of the body.

Example 9 may include the apparatus of example 1 and/or any other example disclosed herein, for which, the electrode arrangement may include a plurality of electrodes which are partially embedded within the body, with a portion of each electrode protruding from the component-handling surface of the body.

Example 10 may include the apparatus of example 1 and/or any other example disclosed herein, for which, the apparatus may further include a dielectric layer or a non-conducting layer over the electrode arrangement.

Example 11 may include the apparatus of example 1 and/or any other example disclosed herein, for which, the apparatus may further include a traction layer over the component-handling surface of the body, such that an outer surface of the traction layer is capable of directly engaging the first semiconductor component arrangement and the second semiconductor component arrangement.

Example 12 may include the apparatus of example 1 and/or any other example disclosed herein, for which, the body includes or may be composed of a semiconductor material.

Example 13 provides a system (e.g. a handling system). The system may include a movement assembly, and a handling assembly (i.e. an apparatus) coupled to the movement assembly. The handling assembly may include a body including a component-handling surface, for which, the component-handling surface may include a first component-handling region configured to accommodate a first semiconductor component arrangement and a second component-handling region configured to accommodate a second semiconductor component arrangement. The handling assembly may further include an electrode arrangement disposed at or on the body in a manner so as to be capable of independently toggling each of the first component-handling region and the second component-handling region between an active state and an inactive state, for which, in the active state the electrode arrangement may provide an electrostatic retention force at the component-handling region, for which, the electrostatic retention force may be configured to retain a corresponding semiconductor component arrangement on the component-handling region. Additionally, the movement assembly may be configured to move the handling assembly.

Example 14 may include the apparatus of example 13, for which, the system may further include a power source configured to supply power to the electrode arrangement.

Example 15 provides a method. The method may include providing a body of a handling assembly. The body may include a component-handling surface, the component-handling surface including a first component-handling region configured to accommodate a first semiconductor component arrangement and a second component-handling region configured to accommodate a second semiconductor component arrangement. The method may further include disposing an electrode arrangement at or on the body in a manner so or such that the electrode arrangement may be capable of independently toggling each of the first component-handling region and the second component-handling region between an active state and an inactive state. The method may further include configuring the electrode arrangement such that, in the active state the electrode arrangement may provide an electrostatic retention force at the component-handling region, for which, the electrostatic retention force may be configured to retain a corresponding semiconductor component arrangement on the component-handling region.

Example 16 may include the apparatus of example 15 and/or any other example disclosed herein, for which, the method may further include providing at least one positive electrode and at least one negative electrode as part of the electrode arrangement. The method may further include configuring the at least one positive electrode and the at least one negative electrode to generate the electrostatic retention force.

Example 17 may include the apparatus of example 15 and/or any other example disclosed herein, for which, the method may further include providing a plurality of electrodes as part of the electrode arrangement. The method may further include embedding the plurality of electrodes of the electrode arrangement within the body in a manner such that a portion of the body is interposed between the plurality of electrodes and the component-handling surface of the body.

Example 18 may include the apparatus of example 15 and/or any other example disclosed herein, for which, the method may further include disposing a dielectric layer or a non-conducting layer on or over the electrode arrangement.

Example 19 may include the apparatus of example 15 and/or any other example disclosed herein, for which, the method may further include disposing a traction layer over the component-handling surface of the body, such that an outer surface of the traction layer may be capable of directly engaging the first semiconductor component arrangement and the second semiconductor component arrangement.

Example 20 may include the apparatus of example 15 and/or any other example disclosed herein, for which, the method may further include disposing the first semiconductor component arrangement on the first component-handling region and disposing the second semiconductor component arrangement on the second component-handling region. The method may further include generating, using the electrode arrangement, a first electrostatic retention force at the first component-handling region to retain the first semiconductor component arrangement thereon and a second electrostatic retention force at the second component-handling region to retain the second semiconductor component arrangement thereon. The method may further include positioning the body of the handling assembly over a semiconductor substrate with the component-handling surface facing the semiconductor substrate. The method may further include ceasing the first electrostatic retention force so that the first semiconductor component arrangement is released from the first component-handling region of the component-handling surface onto the semiconductor substrate. Additionally, the first electrostatic retention force may be ceased while the second electrostatic retention force is provided by the electrode arrangement.

The invention claimed is:

1. An apparatus comprising:

a body comprising a component-handling surface, wherein the component-handling surface comprises a first component-handling region configured to accommodate a first semiconductor component arrangement and a second component-handling region configured to accommodate a second semiconductor component arrangement; and an electrode arrangement disposed at the body in a manner so as to be capable of independently toggling each of the first component-handling region and the second component-handling region between an active state and an inactive state, wherein in the active state the electrode arrangement provides an electrostatic retention force at the component-handling region, wherein the electrostatic retention force is configured to retain a corresponding semiconductor component arrangement on the component-handling region; and wherein the first component-handling region is of a different shape or size from the second component-handling region.

2. The apparatus of claim 1, wherein the electrode arrangement comprises at least one positive electrode and at least one negative electrode configured to generate the electrostatic retention force.

3. The apparatus of claim 1, wherein the electrode arrangement comprises:

a first electrode sub-arrangement comprising at least one positive electrode and at least one negative electrode which are aligned with the first component-handling region, and a second electrode sub-arrangement comprising at least one other positive electrode and at least one other negative electrode which are aligned with the second component-handling region, wherein, with the first component-handling region in the active state, the first electrode sub-arrangement is configured to generate a first electrostatic retention force at the first component-handling region to retain the first semiconductor component arrangement on the first component-handling region, and wherein, with the second component-handling region in the active state, the second electrode sub-arrangement is configured to generate a second electrostatic retention force at the second component-handling region to retain the second semiconductor component arrangement on the second component-handling region.

4. The apparatus of claim 3, wherein the first electrostatic retention force is of a same magnitude as the second electrostatic retention force.

5. The apparatus of claim 3, wherein the first electrostatic retention force is of a different magnitude from the second electrostatic retention force.

6. The apparatus of claim 1, wherein the first component-handling region is of a same shape or size as the second component-handling region.

7. An apparatus comprising:

a body comprising a component-handling surface, wherein the component-handling surface comprises a first component-handling region configured to accommodate a first semiconductor component arrangement and a second component-handling region configured to accommodate a second semiconductor component arrangement; and an electrode arrangement disposed at the body in a manner so as to be capable of independently toggling each of the first component-handling region and the second component-handling region between an active state and an inactive state, wherein in the active state the electrode arrangement provides an electrostatic retention force at the component-handling region, wherein the electrostatic retention force is configured to retain a corresponding semiconductor component arrangement on the component-handling region; and wherein the electrode arrangement comprises a plurality of electrodes which are fully embedded within the body, with a portion of the body interposed between the plurality of electrodes and the component-handling surface of the body; or wherein the electrode arrangement comprises a plurality of electrodes which are partially embedded within the body, with a portion of each electrode protruding from the component-handling surface of the body.

8. The apparatus of claim 1, wherein the electrode arrangement comprises a plurality of electrodes which are fully embedded within the body, with a portion of the body interposed between the plurality of electrodes and the component-handling surface of the body.

9. The apparatus of claim 1, wherein the electrode arrangement comprises a plurality of electrodes which are partially embedded within the body, with a portion of each electrode protruding from the component-handling surface of the body.

10. The apparatus of claim 1, further comprising:

a dielectric layer or a non-conducting layer over the electrode arrangement.

11. The apparatus of claim 1, further comprising:

a traction layer over the component-handling surface of the body, such that an outer surface of the traction layer is capable of directly engaging the first semiconductor component arrangement and the second semiconductor component arrangement.

12. The apparatus of claim 1, wherein the body comprises a semiconductor material.

13. The apparatus of claim 7, wherein the first component-handling region is of a different shape or size from the second component-handling region.

14. The apparatus of claim 13, wherein the electrode arrangement comprises at least one positive electrode and at least one negative electrode configured to generate the electrostatic retention force.

15. The apparatus of claim 13, wherein the electrode arrangement comprises:

a first electrode sub-arrangement comprising at least one positive electrode and at least one negative electrode which are aligned with the first component-handling region, and a second electrode sub-arrangement comprising at least one other positive electrode and at least one other negative electrode which are aligned with the second component-handling region, wherein, with the first component-handling region in the active state, the first electrode sub-arrangement is configured to generate a first electrostatic retention force at the first component-handling region to retain the first semiconductor component arrangement on the first component-handling region, and wherein, with the second component-handling region in the active state, the second electrode sub-arrangement is configured to generate a second electrostatic retention force at the second component-handling region to retain the second semiconductor component arrangement on the second component-handling region.

16. The apparatus of claim 15, wherein the first electrostatic retention force is of a same magnitude as the second electrostatic retention force.

17. An apparatus comprising:

a body comprising a component-handling surface, wherein the component-handling surface comprises a first component-handling region configured to accommodate a first semiconductor component arrangement and a second component-handling region configured to accommodate a second semiconductor component arrangement; and an electrode arrangement disposed at the body in a manner so as to be capable of independently toggling each of the first component-handling region and the second component-handling region between an active state and an inactive state, wherein in the active state the electrode arrangement provides an electrostatic retention force at the component-handling region, wherein the electrostatic retention force is configured to retain a corresponding semiconductor component arrangement on the component-handling region; and wherein the body comprises a semiconductor material.

18. The apparatus of claim 17, wherein the electrode arrangement comprises at least one positive electrode and at least one negative electrode configured to generate the electrostatic retention force.

19. The apparatus of claim 17, wherein the electrode arrangement comprises:

a first electrode sub-arrangement comprising at least one positive electrode and at least one negative electrode which are aligned with the first component-handling region, and a second electrode sub-arrangement comprising at least one other positive electrode and at least one other negative electrode which are aligned with the second component-handling region, wherein, with the first component-handling region in the active state, the first electrode sub-arrangement is configured to generate a first electrostatic retention force at the first component-handling region to retain the first semiconductor component arrangement on the first component-handling region, and wherein, with the second component-handling region in the active state, the second electrode sub-arrangement is configured to generate a second electrostatic retention force at the second component-handling region to retain the second semiconductor component arrangement on the second component-handling region.

20. The apparatus of claim 19, wherein the first electrostatic retention force is of a same magnitude as the second electrostatic retention force.

* * * * *